(12) United States Patent
Hyde et al.

(10) Patent No.: US 8,966,310 B2
(45) Date of Patent: Feb. 24, 2015

(54) REDUNDANCY FOR LOSS-TOLERANT DATA IN NON-VOLATILE MEMORY

(71) Applicant: Elwha LLC, a limited liability corporation of the State of Delaware, Bellevue, WA (US)

(72) Inventors: Roderick A. Hyde, Redmond, WA (US); Nicholas F. Pasch, Bellevue, WA (US); Clarence T. Tegreene, Mercer Island, WA (US)

(73) Assignee: Elwha LLC, Bellevue, WA (US)

( * ) Notice: Subject to any disclaimer, the term of this patent is extended or adjusted under 35 U.S.C. 154(b) by 231 days.

(21) Appl. No.: 13/678,439

(22) Filed: Nov. 15, 2012

(65) Prior Publication Data
US 2014/0136903 A1    May 15, 2014

(51) Int. Cl.
G06F 11/08 (2006.01)
G06F 11/00 (2006.01)
G06F 12/02 (2006.01)
G06F 11/16 (2006.01)

(52) U.S. Cl.
CPC .......... *G06F 11/004* (2013.01); *G06F 12/0223* (2013.01); *G06F 11/1666* (2013.01)
USPC ...................................... 714/6.13

(58) Field of Classification Search
CPC .................................................. G06F 11/1666
USPC ....................................................... 714/6.13
See application file for complete search history.

(56) References Cited

U.S. PATENT DOCUMENTS

| | | |
|---|---|---|
| 5,303,163 A | 4/1994 | Ebaugh et al. |
| 5,533,123 A | 7/1996 | Force et al. |
| 6,366,117 B1 | 4/2002 | Pang et al. |
| 6,708,273 B1 | 3/2004 | Ober et al. |
| 7,100,071 B2 | 8/2006 | Olarig |
| 7,133,498 B2 | 11/2006 | Cacioppo et al. |
| 7,203,842 B2 | 4/2007 | Kean |
| 7,890,691 B2 | 2/2011 | Jiang |
| 7,996,642 B1 | 8/2011 | Smith |
| 8,015,357 B2 | 9/2011 | Strumper et al. |
| 8,171,204 B2 | 5/2012 | Chow et al. |
| 8,572,311 B1 * | 10/2013 | Shalvi et al. ................... 711/103 |
| 8,880,980 B1 | 11/2014 | Mathew et al. |
| 2002/0114201 A1* | 8/2002 | Aikawa et al. ................ 365/200 |
| 2003/0072190 A1* | 4/2003 | Miki et al. ..................... 365/200 |
| 2004/0039845 A1 | 2/2004 | Feldmeier et al. |
| 2004/0236954 A1 | 11/2004 | Vogt et al. |
| 2005/0002234 A1 | 1/2005 | Yang |
| 2006/0221715 A1 | 10/2006 | Ma et al. |
| 2006/0259848 A1 | 11/2006 | Blevins |
| 2007/0045425 A1 | 3/2007 | Yoshida et al. |
| 2007/0121575 A1 | 5/2007 | Savry et al. |
| 2007/0129812 A1 | 6/2007 | Ferchau |
| 2007/0136534 A1 | 6/2007 | Mesard et al. |
| 2007/0234323 A1 | 10/2007 | Franaszek et al. |
| 2007/0294494 A1 | 12/2007 | Conti et al. |
| 2008/0136602 A1 | 6/2008 | Ma et al. |
| 2008/0184057 A1 | 7/2008 | Thorp et al. |
| 2008/0184065 A1 | 7/2008 | Thorp et al. |
| 2008/0193133 A1 | 8/2008 | Krug et al. |
| 2008/0263117 A1 | 10/2008 | Rose et al. |

(Continued)

*Primary Examiner* — Chae Ko

(57) ABSTRACT

A memory device includes a memory array including a plurality of memory sections characterized by a plurality of memory types and control logic integrated with and distributed over the memory array. The control logic is operable to selectively allocate redundant sections in the plurality of memory sections.

33 Claims, 27 Drawing Sheets

(56) References Cited

U.S. PATENT DOCUMENTS

| | | |
|---|---|---|
| 2009/0049111 A1 | 2/2009 | Chari et al. |
| 2009/0103379 A1 | 4/2009 | Zhang et al. |
| 2009/0165086 A1 | 6/2009 | Trichina et al. |
| 2009/0234916 A1 | 9/2009 | Cosentino et al. |
| 2009/0292871 A1* | 11/2009 | Watanabe et al. ............ 711/114 |
| 2010/0027788 A1 | 2/2010 | Tkacik et al. |
| 2010/0049751 A1 | 2/2010 | Giampaolo et al. |
| 2010/0064111 A1* | 3/2010 | Kunimatsu et al. .......... 711/161 |
| 2010/0070549 A1 | 3/2010 | Nagaraj |
| 2010/0115330 A1* | 5/2010 | Khatri et al. ...................... 714/6 |
| 2010/0148232 A1 | 6/2010 | Ng et al. |
| 2010/0250848 A1 | 9/2010 | Kim |
| 2010/0262773 A1 | 10/2010 | Borchers et al. |
| 2010/0293317 A1 | 11/2010 | Confalonieri et al. |
| 2011/0022932 A1 | 1/2011 | Radke |
| 2011/0093675 A1* | 4/2011 | Lu et al. ........................ 711/162 |
| 2011/0172498 A1 | 7/2011 | Olsen et al. |
| 2012/0079318 A1 | 3/2012 | Colgrove et al. |
| 2012/0147937 A1 | 6/2012 | Goss et al. |
| 2012/0172085 A1 | 7/2012 | Vuppu et al. |
| 2012/0179735 A1 | 7/2012 | Ferguson et al. |
| 2012/0198152 A1* | 8/2012 | Terry et al. .................... 711/114 |
| 2012/0233231 A1 | 9/2012 | Vasyltsov et al. |
| 2012/0233232 A1 | 9/2012 | Vergnes et al. |
| 2012/0265923 A1 | 10/2012 | Kuo et al. |
| 2012/0278584 A1* | 11/2012 | Nagami et al. ................ 711/170 |
| 2013/0007374 A1 | 1/2013 | Cain, III et al. |
| 2013/0013864 A1 | 1/2013 | Chung et al. |
| 2013/0290792 A1 | 10/2013 | Torla et al. |
| 2013/0332705 A1 | 12/2013 | Martinez et al. |
| 2014/0006898 A1 | 1/2014 | Sharon et al. |
| 2014/0040338 A1 | 2/2014 | Van Der Sluis et al. |
| 2014/0104966 A1* | 4/2014 | Oh et al. ................... 365/189.12 |
| 2014/0136583 A1 | 5/2014 | Hyde et al. |
| 2014/0143593 A1 | 5/2014 | Strauss et al. |

\* cited by examiner

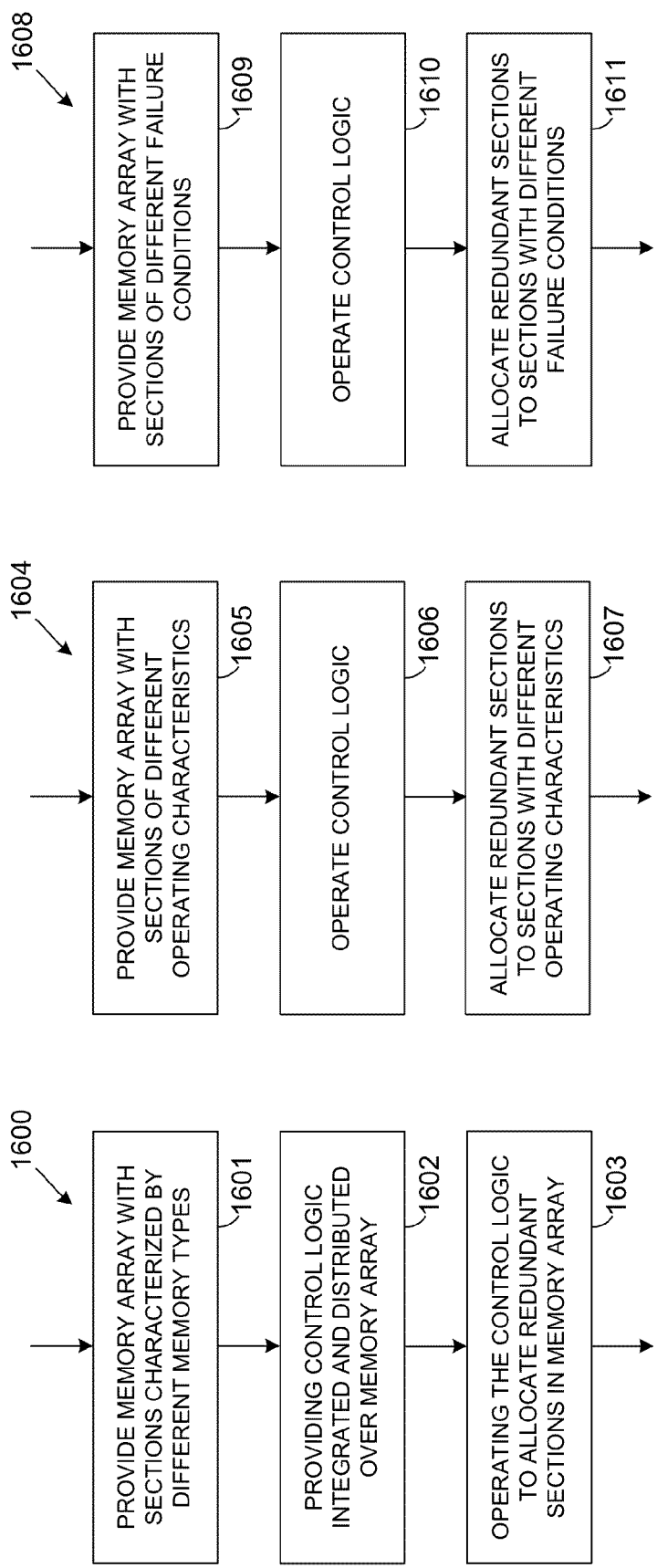

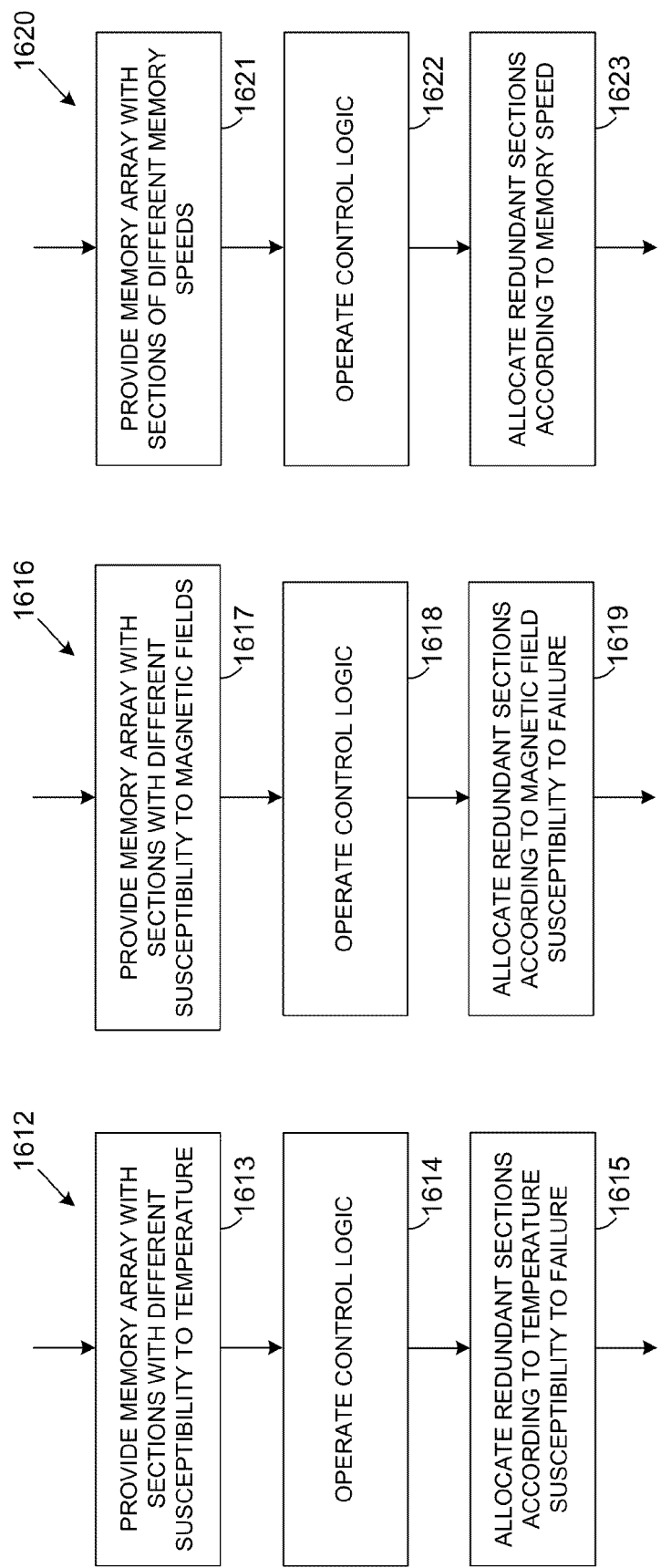

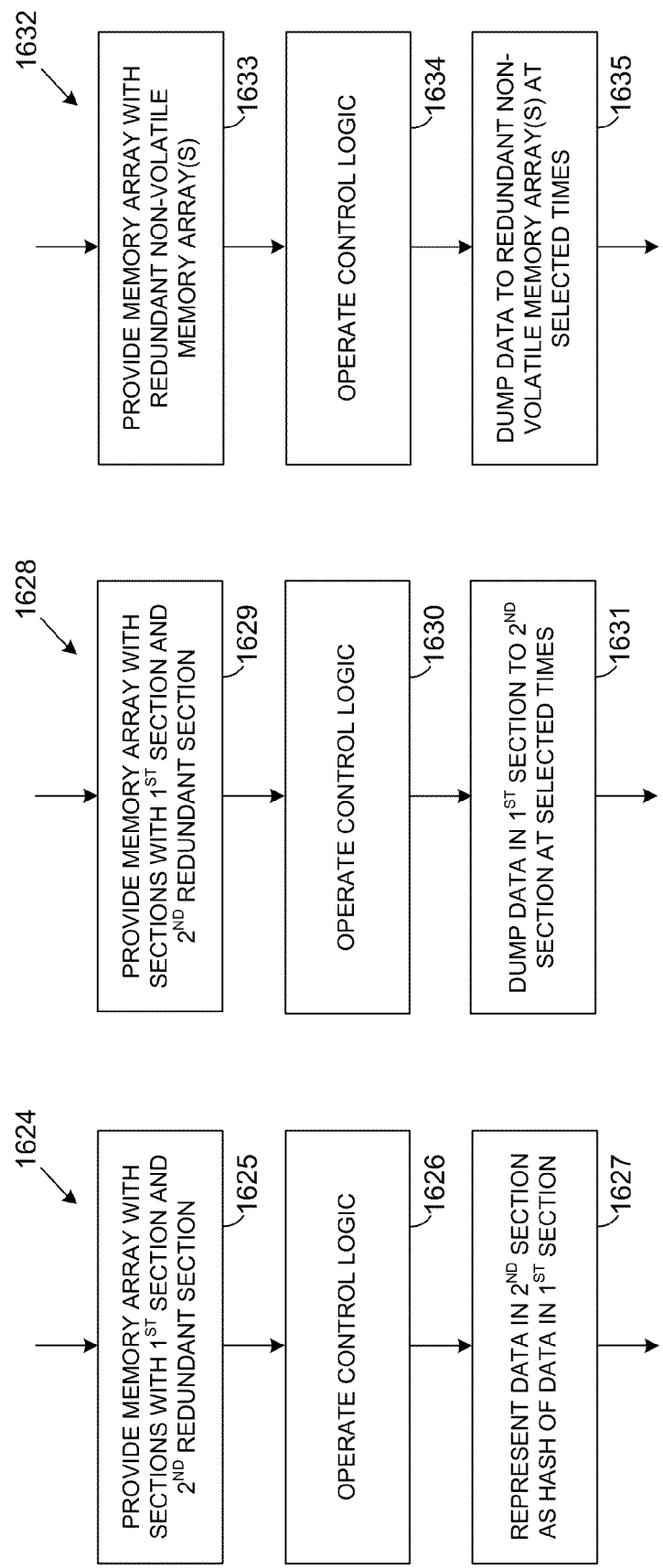

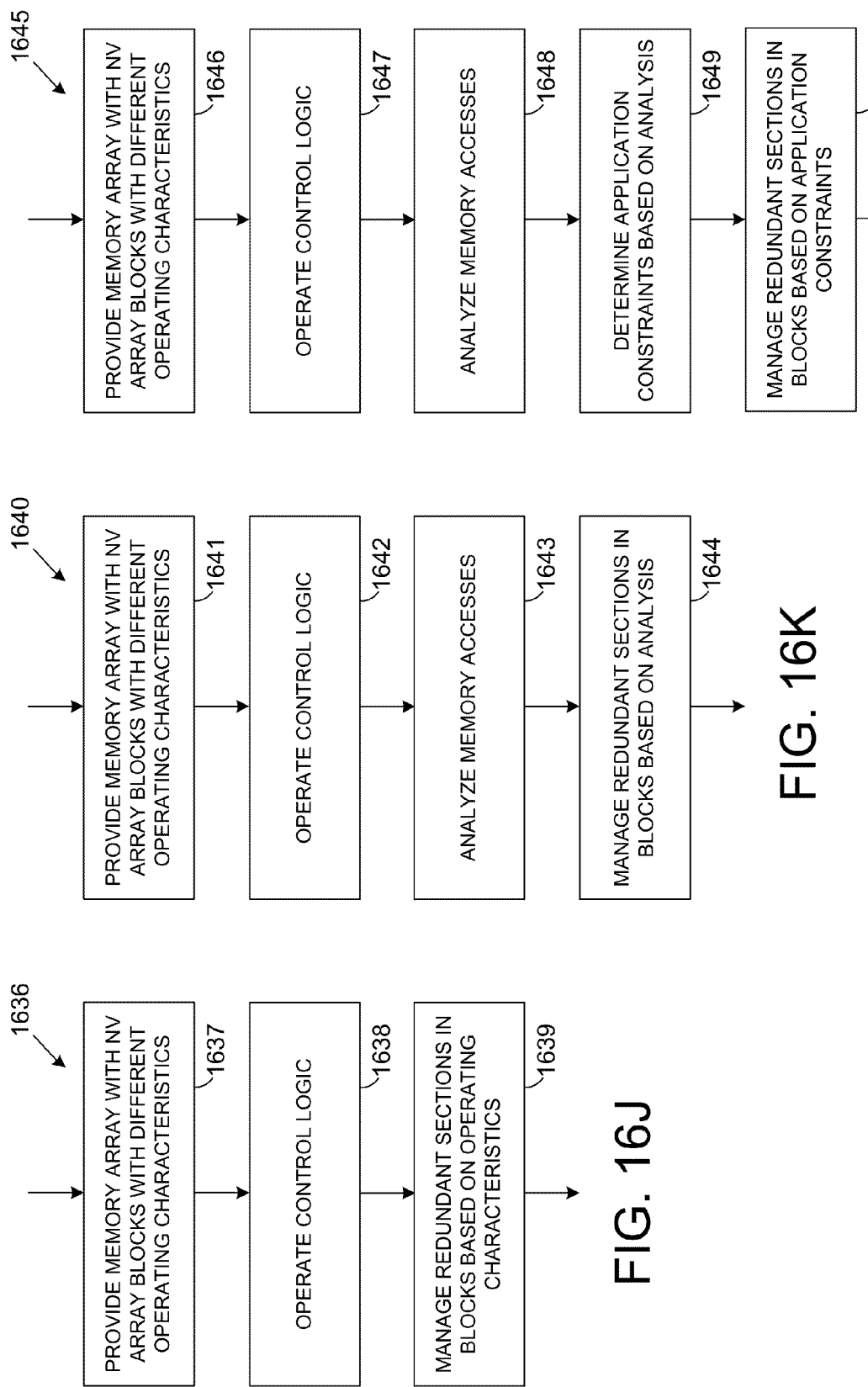

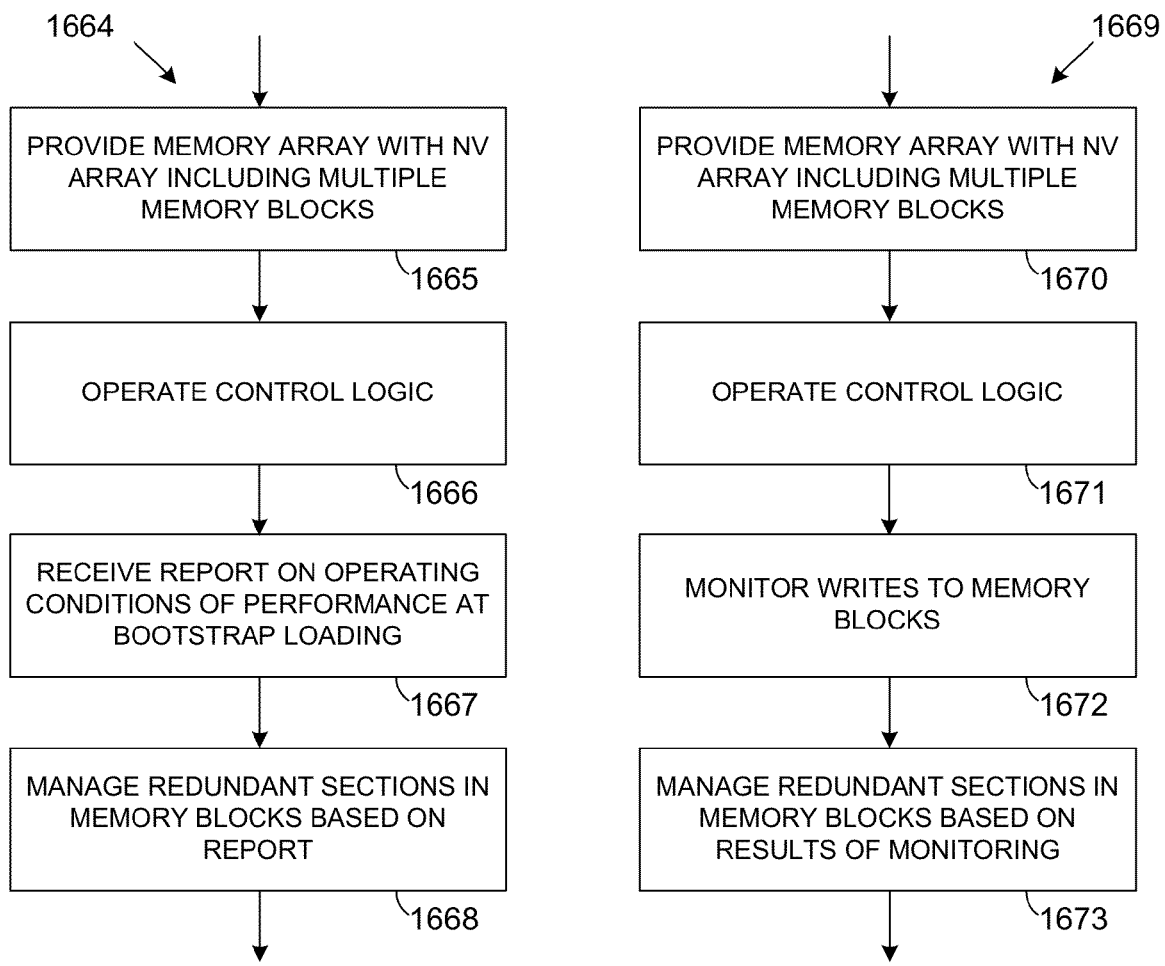

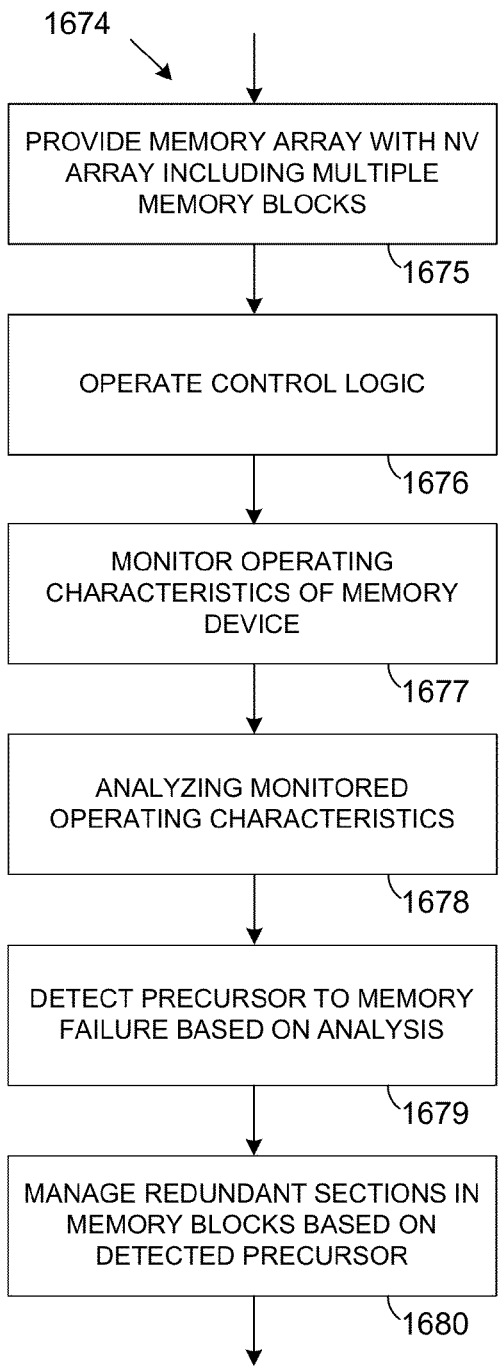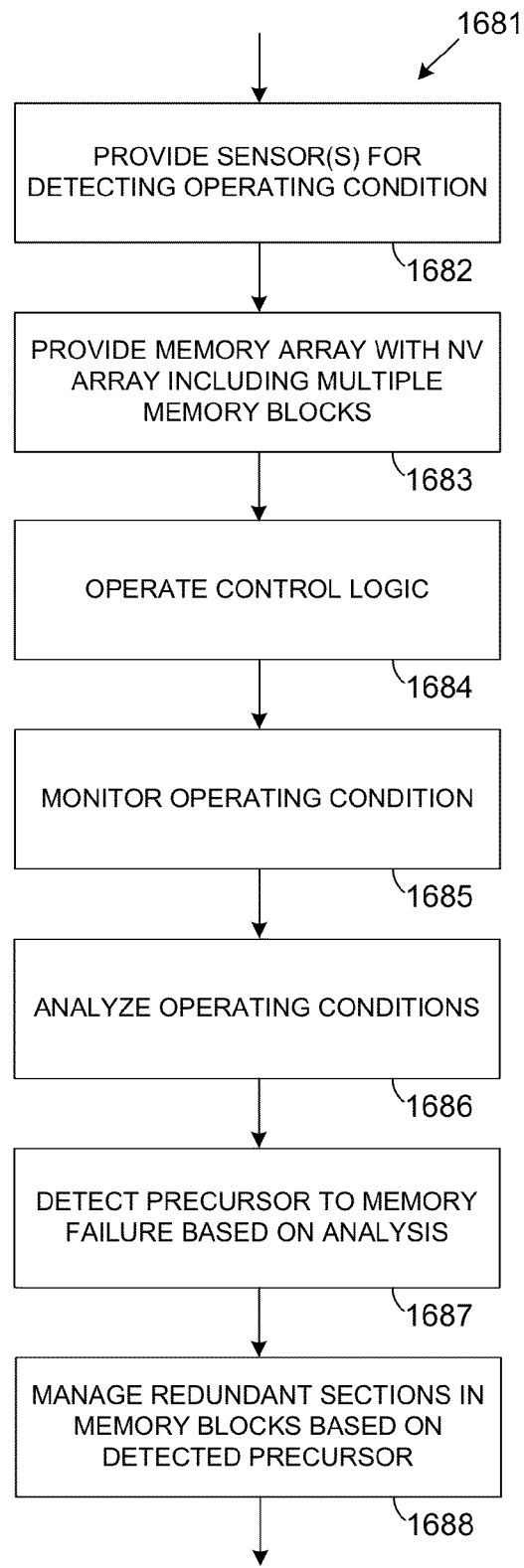
FIG. 16Q
FIG. 16R

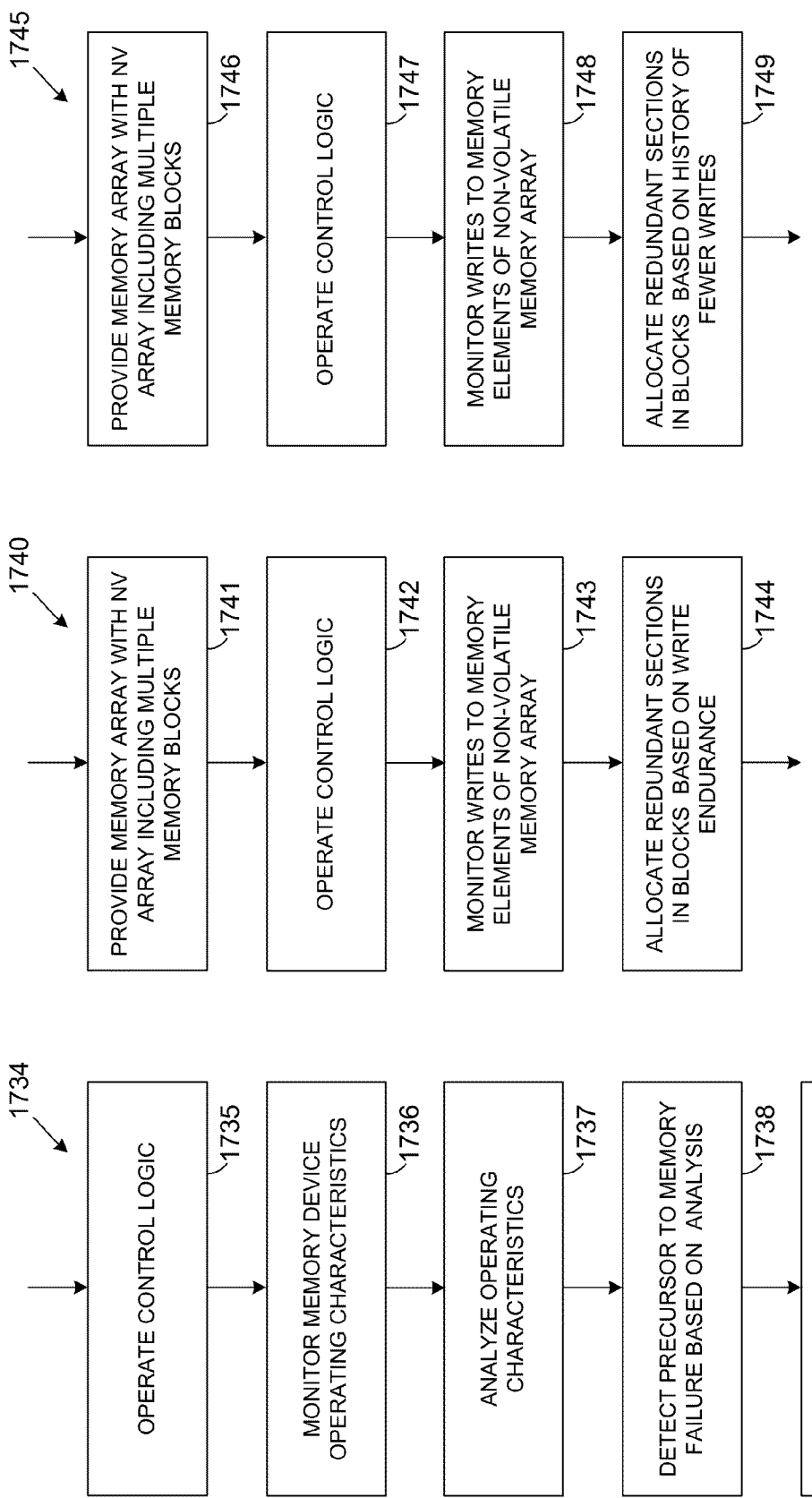

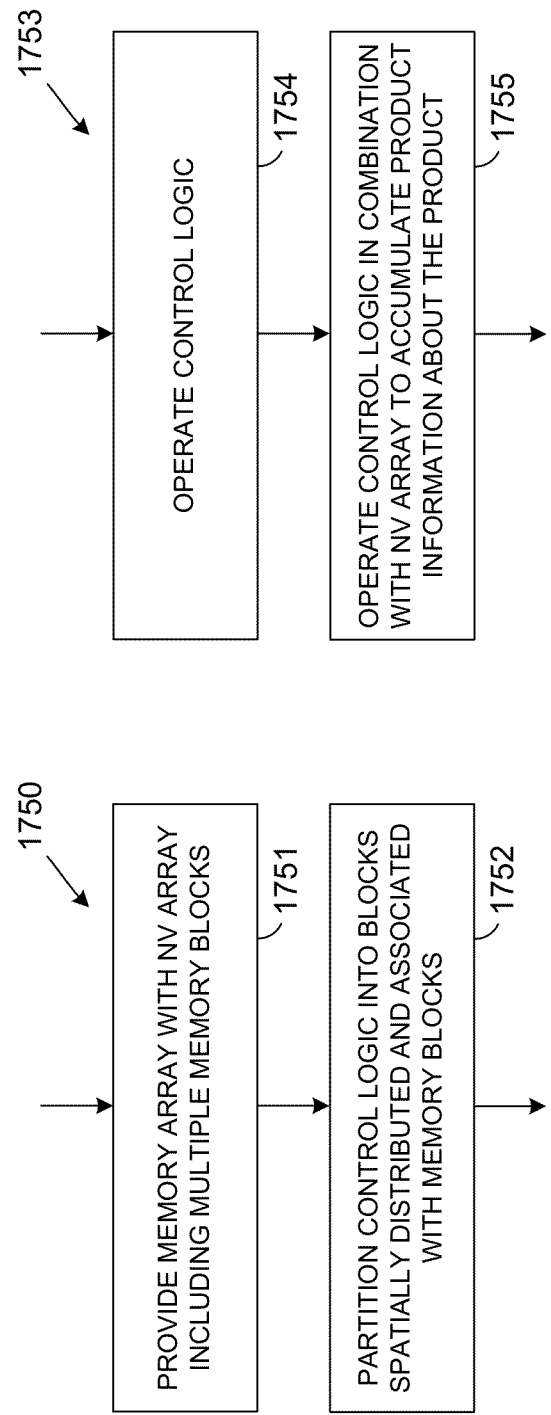

US 8,966,310 B2

REDUNDANCY FOR LOSS-TOLERANT DATA IN NON-VOLATILE MEMORY

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

None.

RELATED APPLICATIONS

U.S. patent application Ser. No. 13/678,430 entitled Intelligent Monitoring for Computation in Memory, naming Roderick Hyde, Nicholas Pasch, and Clarence T. Tegreene as inventors, filed 15 Nov. 2012, is related to the present application.

The United States Patent Office (USPTO) has published a notice to the effect that the USPTO's computer programs require that patent applicants reference both a serial number and indicate whether an application is a continuation, continuation-in-part, or divisional of a parent application. Stephen G. Kunin, Benefit of Prior-Filed Application, USPTO Official Gazette Mar. 18, 2003. The USPTO further has provided forms for the Application Data Sheet which allow automatic loading of bibliographic data but which require identification of each application as a continuation, continuation-in-part, or divisional of a parent application. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant has provided designation(s) of a relationship between the present application and its parent application(s) as set forth above and in any ADS filed in this application, but expressly points out that such designation(s) are not to be construed in any way as any type of commentary and/or admission as to whether or not the present application contains any new matter in addition to the matter of its parent application(s).

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

TECHNICAL FIELD

The present disclosure relates to electronic memory and systems associated with electronic memory.

SUMMARY

In one aspect, a memory device includes but is not limited to a memory array including a plurality of memory sections characterized by a plurality of memory types and control logic integrated with and distributed over the memory array. The control logic is operable to selectively allocate redundant sections in the plurality of memory sections. In addition to the foregoing, other aspects are described in the claims, drawings, and text forming a part of the present disclosure.

In one aspect, method of operating a memory device includes but is not limited to providing a memory array including a plurality of memory sections characterized by a plurality of memory types and providing a control logic integrated with and distributed over the memory array. The method can further include operating the control logic to selectively allocate redundant sections in the plurality of memory sections. In addition to the foregoing, other aspects are described in the claims, drawings, and text forming a part of the present disclosure.

In one aspect, a memory system includes but is not limited to means for storing information in a memory array including a plurality of memory sections characterized by a plurality of memory types, means integrated with and distributed over the memory array for controlling the means for storing information, and means for selectively allocating redundant sections in the plurality of memory sections. In addition to the foregoing, other aspects are described in the claims, drawings, and text forming a part of the present disclosure.

In one aspect, a system can be formed of circuitry. The system includes but is not limited to circuitry for storing information in a memory array including a plurality of memory sections characterized by a plurality of memory types, circuitry integrated with and distributed over the memory array for controlling the means for storing information, and circuitry for selectively allocating redundant sections in the plurality of memory sections. In addition to the foregoing, other aspects are described in the claims, drawings, and text forming a part of the present disclosure.

BRIEF DESCRIPTION OF THE DRAWINGS

Embodiments of the invention relating to both structure and method of operation may best be understood by referring to the following description and accompanying drawings:

FIGS. 16A through 16S and FIGS. 17A through 17K are schematic flow charts showing several embodiments and/or aspects of a method of operating a memory device for storing information to facilitate engineering acceptable redundancy for loss-tolerant data using control and/or computation logic integrated into memory.

DETAILED DESCRIPTION

Figure 1A:
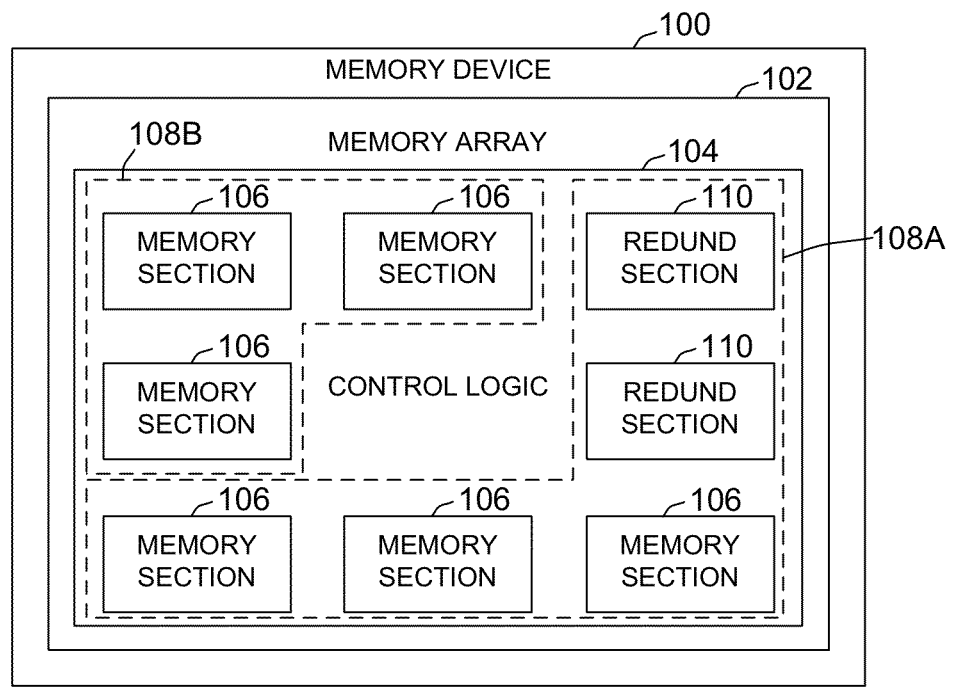
FIGS. 1A and 1B are schematic block diagrams depicting top and side views of embodiments of a memory device that is operable to facilitate engineering acceptable redundancy for loss-tolerant data via use of memories.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

While various aspects and embodiments have been disclosed herein, other aspects and embodiments will be apparent to those having ordinary skill in the art. The various aspects and embodiments disclosed herein are for purposes of illustration and are not intended to be limiting, with the true scope and spirit being indicated by the following claims.

The various memory systems and devices disclosed herein are expected to be useful in many applications and contexts, and are further anticipated to be particularly useful in cloud computing and mobile contexts. In some configurations, the disclosed memory systems and devices can be used in system-on-a-chip (SOC) applications as processing and memory are distributed in more and more locations and applications throughout our technologically advancing society. The various memory systems and devices can include non-volatile memory including flash memory and electrically erasable programmable read-only memory (EEPROM) for usage in many electronic devices, such as mobile and cell phones, notebook computers, personal digital assistants, medical devices, medical diagnostic systems, digital cameras, audio players, digital televisions, automotive and transportation engine control units, USB flash personal discs, and global positioning systems.

In various applications and contexts, memory systems can include non-volatile memory integrated with a processor or other control logic, and a bus or other communications interface. As non-volatile memories and integrated system continue to evolve, their role in overall systems continue to expand to include various aspects of computation that is facilitated, for example, by phase-change memory in which passage of current switches a memory material between two states, crystalline and amorphous, or additional states that further elevate storage capacity.

Figure 1B:
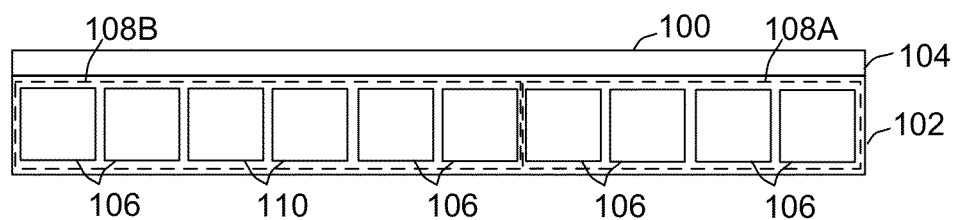

Referring to FIGS. 1A and 1B, schematic block diagrams depict top and side views of embodiments of a memory device that is operable to facilitate engineering acceptable redundancy for loss-tolerant data via use of memories. In an illustrative embodiment, a memory device 100 can include a memory array 102 including a plurality of memory sections 106 characterized by a plurality of memory types 108A,108B and control logic 104 integrated with and distributed over the memory array 102. The control logic 104 is operable to selectively allocate redundant sections 110 in the plurality of memory sections 106.

The memory device can include multiple types of memory including the non-volatile memory array in the form of multiple types of non-volatile memory technologies, in addition to portions of memory that may be volatile. The memory device may include multiple types of memory for use in a redundant fashion. Accordingly, the memory device can include two or more memory segments of any non-volatile memory type or technology including read-only memory, flash memory, ferroelectric random access memory (F-RAM), magneto-resistive RAM (M-RAM) or the like. The control logic can operate a segment of M-RAM which is comparable in speed and capacity to volatile RAM while enabling conservation of energy, rapid or instantaneous start-up and shutdown sequences. In other applications, the memory device can include memory in the form of charge-coupled devices (CCDs) that are not directly addressable or other pure solid state memory that is reliable and inexpensive for use as separate memory device for various applications such as cell phones, and the like.

Some types of memory can be susceptible to failure under specified conditions. For example, two-terminal non-volatile memory devices based on resistance switching effects, called memristors, are susceptible to damage from temperature and bias field conditions. Placing a memristor in an oven or applying a bias field can erase the entire memory. A memory device can include a portion of memory which is susceptible to a particular condition and another, redundant portion which is resistant to the condition, thereby enabling operation in a RAID (redundant array of independent disk) array fashion to ensure retention of data during condition episodes. In case of accidental erasure, the control logic can perform functionality analogous to that of a RAID array, for example, to use a slow memory that is impervious to magnetic fields to rebuild the erased data. In a particular embodiment, the slow memory can maintain hash tables are can be heat or magnetic-resistant. A two-way hash can be used to represent data as a hash, thereby reducing memory size.

For a memory device that includes sufficiently large and inexpensive memory, the control logic can perform a copy function at predetermined intervals, for example every 50 cycles or other selected rate, to copy the state to a redundant fast memory for copying to a slow memory, and to facilitate decision-making in memory. Thus, the memory can control sampling with the control logic including sampling functionality, and sampling of fast memory. For applications or contexts such as video handling in which only intermittent frames are sufficient to produce a suitable video image, a backup into lossy memory may be suitable to enable a basic recovery of data. In some embodiments, the memory device may include excess memory in the form of flip-chip via a dedicated bus to send data from a first fast memory to a second fast memory.

In some applications and/or embodiments, a memory device can incorporate reduced data set redundancy in which a data copy can be compressed in a suitable manner. The control logic can perform redundant data management relatively slowly, avoiding the heat buildup that can result from a fast data transfer. Thus, redundant backup memory buses can be run at comparatively slow speed, thereby avoiding a significant increase in the heat budget for redundancy processing.

In some embodiments, the memory device can facilitate engineering acceptable redundancy for loss-tolerant data by virtue of a large distributed area of processing or logic which can be spread over a relatively large area of memory storage. In some embodiments, the processor can be formed of logic that is relatively low capability or relatively low quality, for example to enable a small number of relatively simple operations, thereby reducing the number of layers of silicon in the integrated circuit chip, and possibly reducing power requirements and heat dissipation. The processing logic of such a processor-in-memory (PIM) can be widely distributed over the area of memory storage. The intelligent monitoring memory device can be formed as at least part of a system-on-a-chip (SOC).

In various embodiments, the memory device can include control logic formed in a limited number of metal layers within the memory logic. To avoid stacking of multiple layers of silicon processing on the memory chip, the control logic can be spread laterally across the memory array circuitry. Limited complexity of operations implemented on the memory device circuit enables slower computation speed in comparison to a typical central processing unit (CPU). Such slower computation speeds are suitable since the limiting factor in transfers of data from a processor to memory is the data bus.

The control logic can be configured to reduce the percentage of transistor underutilization, called "dark silicon", by breaking up of the command structure of central blocks. The control logic can be further configured to enhance efficiency by performing background operations such as sorting of data within the memory while the system is idle.

In some embodiments, the memory device can be configured with control logic with an abbreviated set of specific, basic functions in which simple operations can be off-loaded from a processor external to the memory device and moved onto the memory device. For example, context request blocks can be removed from the processor into the memory device, for example for security purposes since the context request blocks are typically not located in the memory.

Embodiments of the memory device with a reduced-functionality control logic can facilitate efficient operation of the memory device while maintaining the integrated circuit simplicity and yield of the memory device. Typically, the number of metal layers in a memory integrated circuit is substantially smaller than that of a processor circuit. Reducing the complexity of the control logic can allow fabrication with fewer metal layers.

In various embodiments, functionality control logic can be attained by one or more of several techniques. For example, computations can be simplified by implementing relatively simple tasks in the control logic or by acknowledging that a particular section of the memory is predominantly subject to a limited number of simple operations which can be implemented in the control logic while other operations that rarely are applied to the memory section can be performed by processing external to the memory device. In another example, for operations or applications characterized by a limited or coarse accuracy, such as relatively low-grade video signals, processing can be based on estimation. In a further example, the control logic can include support for multiple functions in which circuitry for the different functions can be spread over a distributed area of the non-volatile memory array, forming a large distributed area of simple processing functionality.

In some embodiments of the memory device depicted in FIGS. 1A and 1B, the memory device 100 can be configured such that the memory array 102 includes the plurality of memory sections 106 including multiple different operating characteristics. The control logic 104 can be operable to allocate the redundant sections 110 to memory sections 106 with different operating characteristics.

Different types of memory can have different operating characteristics. The memory device can be formed of multiple memory segments that have different operating characteristics, for example in aspects of speed, power consumption, size, as well as susceptibility or resistance to particular operating conditions such as magnetic field characteristics, temperature, and voltage. The control logic can operate as a memory controller integrated with the non-volatile memory array to allocate redundant storage taking into consideration memory type. In some applications, the control logic can optimize for the particular memory type depending, for example, on application constraints such as the amount of computation, energy consumption load, and many other conditions. For example, control logic metadata can supplies intra-memory hints about heat generation.

For example, in some embodiments, the memory device can include both phase change memory (PCRAM) and other memory types and the control logic can assign memory usage according to various operating characteristics such as available power. In a specific example, PCRAM and DRAM may be selected based on power considerations. PCRAM access latencies are typically in the range of tens of nanoseconds, but remain several times slower than DRAM. PCRAM writes use energy-intensive current injection, causing thermal stress within a storage cell that degrades current-injection contacts and limits endurance to hundreds of millions of writes per cell. In a memory device that uses both PCRAM and DRAM, the control logic can allocate memory usage according to the write density of an application.

In a memory device that includes multiple different types of memory including a spin-transfer M-RAM, the control logic can assign functionality at least in part based on the magnetic properties of memory. In a system that includes at least one portion of F-RAM, the control logic can exploit operating characteristics of extremely high endurance, very low power consumption (since F-RAM does not require a charge pump like other non-volatile memories), single-cycle write speeds, and gamma radiation tolerance. The memory device can include different segments of different types of memory including volatile and non-volatile memory, flash, dynamic RAM (DRAM) and the like, and use the control logic to attain different performance/cost benefits.

In other example embodiments of the memory device depicted in FIGS. 1A and 1B, the memory device 100 can be constructed with the memory array 102 including the plurality of memory sections 106 including a plurality of different failure conditions. The control logic 104 can be operable to allocate the redundant sections 110 to memory sections 106 with different failure conditions.

Accordingly, the control logic can be used to predict how and when failures will take place using any suitable information for making the prediction and manage redundant memory according to the prediction. For example, the control logic can use temperature measurements to predict failure or use various forms of information to make predictions and ensure that redundant data is maintained according to the prediction. In a particular embodiment, the control logic can enable writing data at a high rate in some conditions and limit writing speed in other conditions. For example, at high temperatures for a memory that is susceptible to failure, the control logic can determine whether the temperature is sufficiently high to call for writing of data from a memory type susceptible to failure to a memory type resistant to temperature failure. IN some embodiments, the control logic can limit writing speed to a low rate while allowing higher write data rates at lower temperature. In some applications or contexts, the control logic can perform performance mapping at selected time intervals, for example updating a map of sections of memory every 10,000 writes. The operating logic can determine how the memory is used and project back to determine characteristics of the operating environment.

In various embodiments and/or applications of the memory device depicted in FIGS. 1A and 1B, the memory device 100 can be configured with control logic 104 operable to monitor a history and pattern of memory accesses and selectively manage redundant sections 110 in the plurality of memory sections 106 during system idle. Accordingly, the memory array 102 can be configured and operated to store a history of accesses, patterns of data calls, and the like.

Other embodiments of the memory device 100 depicted in FIGS. 1A and 1B can have control logic 104 operable to monitor memory accesses, perform pattern recognition of the monitored memory accesses, and selectively manage redundant sections 110 in the plurality of memory sections 106 based on recognized patterns. In particular embodiments, the control logic can perform pattern recognition in an integrated circuit chip and perform analysis in operations that are background to data communication via a bus to a device such as a processor external to the memory device. Background tasks that are local to the memory device can include maximum and minimum sorting, medium, and mode computation. Operations perform by the control logic can include statistical measurements, indexing, synchronizing, detection of repetitive tasks, and the like.

In other example embodiments and/or applications, the control logic can be operable to monitor memory accesses, detect a pattern of instructions and data from the monitored memory accesses, predict expected instructions and data from the detected pattern of instructions and data, and preprocessing the predicted expected instructions. In some applications, the control logic can use the statistics to predict a future sequence of instructions and data. The control logic can detect patterns in which a first sequence of data and/or instructions is commonly followed by a second sequence. Upon detection of such a first sequence, the control logic can apply the second sequence to the memory without actually receiving the second sequence, for example from a processor via the data bus. Thus, the control logic can accelerate data handling and work throughput. The control logic can monitor data and/or instructions and anticipate requests for memory. The control logic can also detect an indexing pattern of instructions and interactions with memory using specialized logic that is integrated into the non-volatile memory area, enabling preprocessing of expected instructions within the memory.

The control logic thus can perform statistical operations that analyze instruction sequences to predict the type of instructions to perform using logic that is distributed within the non-volatile memory arrays of the memory device.

In further applications or contexts for embodiments of the memory device 100, the control logic 104 can be operable to manage redundant sections 110 in the plurality of memory sections 106 independently of signals external to the memory device 100. Accordingly, the control logic 104 can be operable to monitor memory accesses, determine statistics on type and number of instructions of the monitored memory accesses, and predict a sequence of instructions and data using the determined statistics. The control logic can oversee operations of an overall system, maintaining statistics on the type and number of instructions communicated and processed.

Embodiments of the memory device depicted in FIGS. 1A and 1B, can be configured to detect a precursor of memory failure and copy data from memory identified by the precursor to safe memory. For example, the memory device 100 can be configured with control logic 104 operable to monitor operating characteristics of the memory device 100, analyze the monitored operating characteristics, detect a precursor to a memory failure based on the analysis, and manage redundant sections 110 in the plurality of memory sections 106 based on the detected precursor.

For example, in some embodiments or applications a capability for the memory device to efficiently support both bit maps and vector graphics may be useful. Accordingly, the memory device can be configured so that the memory includes a portion that is bit-mapped and a portion that is vector memory. For example, part of the memory can be optimized for pictures and video (JPEG) and another portion optimized for more computational applications. An example of such that context that would benefit from both memory types is a mobile telephone with camera and/or video functionality.

Figure 2A:
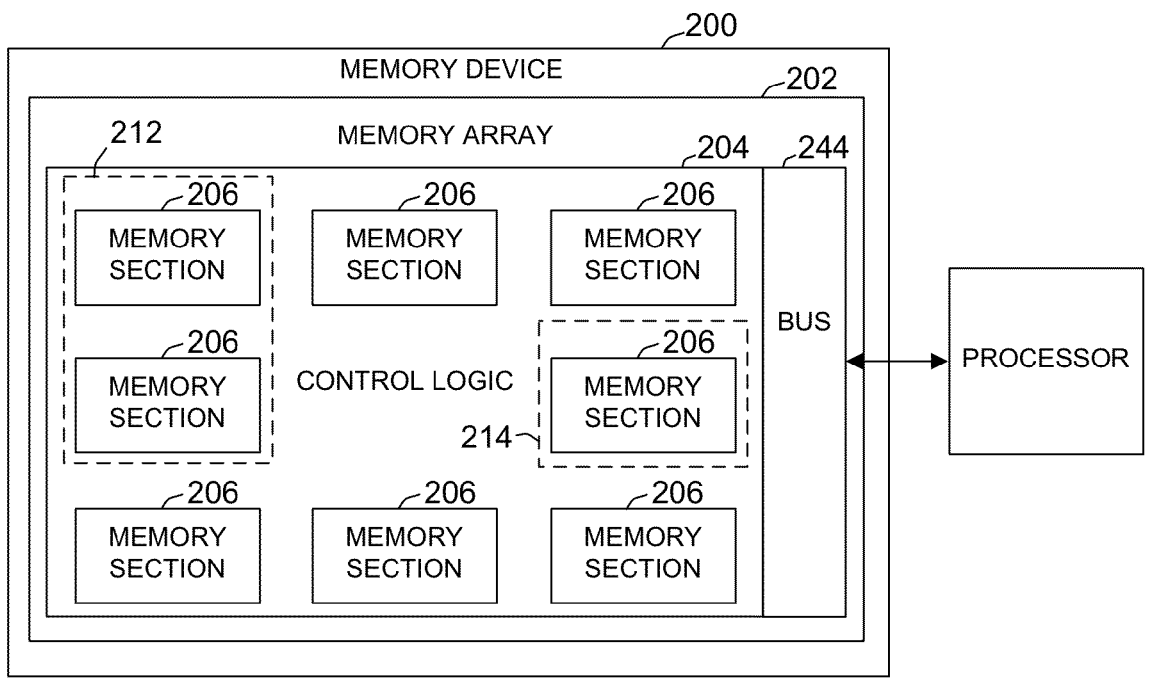
FIGS. 2A and 2B are schematic block diagrams showing respective top and side view of an embodiment of a memory device that is operable to facilitate engineering acceptable redundancy for loss-tolerant data via use of memories in variable temperature environments.
Figure 2B:
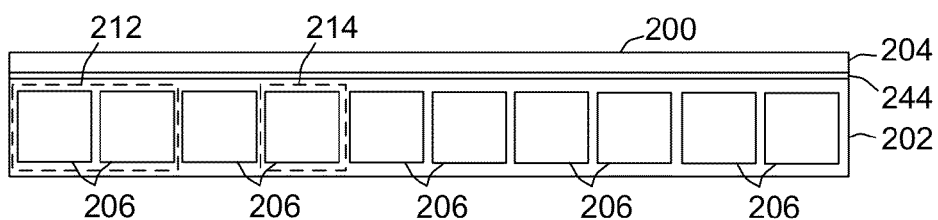

Referring to FIGS. 2A and 2B, schematic block diagrams show respective top and side view of an embodiment of a memory device that is operable to facilitate engineering acceptable redundancy for loss-tolerant data via use of memories in variable temperature environments. The memory device 200 can be formed such that the memory array 202 includes in the plurality of memory sections 206 at least one memory section susceptible to failure due to a temperature condition 212 and at least one memory section resistant to the failure due to the temperature condition 214. The control logic 204 can be is operable to allocate the at least one memory section resistant to the failure due to the temperature condition 214 redundant to the at least one memory section susceptible to failure due to a temperature condition 212.

Referring to FIGS. 2A and 2B, schematic block diagrams show respective top and side view of an embodiment of a memory device that is operable to perform intelligent memory computation using control logic that is distributed in memory and includes a bus for communication with devices external to the memory device such as one or more processors. In various embodiments, the memory device 200 may further include a bus 244 integrated with the control logic 204 and the memory array 202. The memory device can facilitate communication and handle additional bandwidth via usage of control logic that can predict subsequent transfers and write to memory accordingly to enable processing on the predicted data values. In some embodiments, the memory device can include communication channels in addition to the bus to facilitate transfer of information for various management functions, alleviating the traffic on the bus 244.

The bus 244 forms a communication interface that can communicate with other such devices or any type of device or system to enable multiple distributed devices to intercommunicate or to communicate with a network, for example in a cloud system. Thus, the memory device can be widely distributed or even ubiquitous, to perform selected local processing regarding usage and environment, for example to enable history tracking, data pre-processing, and sharing to other devices or through the cloud.

In particular example embodiments, the memory device 200 can also include a communication interface in which optical silicon (not shown) is integrated with the memory array 202 and the control logic 204 to enable integrated circuits including the memory device 200 to intercommunicate. Usage of optical silicon can enable the memory device to avoid the bandwidth and bottleneck problems of a system bus. The optical silicon can enable data to pass more quickly from outside the memory device to the memory. The memory device can support a WiFi network which optimizes memory for a particular application. Optical silicon can be used to alleviate some of the bandwidth problem for reading high volumes of data, such as for moving photographs from a camera or camera-phone to a storage device such as a computer or library. The bus can manage redundant storage by writing a copy of redundant data via the optical link to a redundant memory in a manner that does not interfere with the data path formed by the bus 244.

The memory device can thus be used for a wide variety of data communication operations to enable concentration of data originating from many sources. In particular arrangements, a memory device can include multiple types of memory with multiple memory characteristics in terms of cost, price, power, reliability, and the like. A memory device can be optimized to any desired characteristic such as memory quality, memory power, cost in terms of number of electrons, noise, power consumption, and others. For example, power consumption can be optimized by lowering access threshold. The control logic can be configured to determine the source of noise, for example if noisy during writing, the control logic can determine how little write current can be used, thereby reducing power consumption. The control logic can be used to monitor electrical characteristics such as power or charge. Only so many electrons are available in a memory and the control logic can be configured to determine how few electrons can be used to perform a particular operation such as read/write operations.

In a particular embodiment, the memory device 200 can further include optical silicon which is operable to communicate optically, independently of a bus 244 coupled to the memory device 200 in which the control logic 204 is operable to receive functions for tracking applications and processes independently of communication via the bus 244. For example, an optical sensor or silicon-based optical data connection can use silicon photonics and a hybrid silicon laser for communication between integrated circuit chips at distributed locations using plasmons (quanta of plasma oscillation) to communicate over relatively long distances, for example 2-3 inches on a narrow nano-wire coupler. The plasmon is a quasi-particle that results from quantization of plasma oscillations. Data can be received and converted using an optical antenna, a nano-cavity, or a quantum dot. The communication field can travel independently of a wired bus structure. For example, the memory device 200 can receive information via the optical link, independently of the system bus connected to a processor, and the control logic 204 can use the extra-bus information to perform management or housekeeping functions to track applications and/or processes (or, for example, bit correction) via data sent optically to the memory device 200. The optical link thus enables low-bandwidth, back-channel communication, enabling formation of a memory that can communicate with large bursts of data for placement with optical accessibility.

The memory device can use the optical communication interface to substantially increase bandwidth. For example, dynamic random access memory (DRAM) cannot maintain synchrony over a distance of about four inches so that DRAM must be within four inches or less of a communicating processor, resulting in the memory bus becoming a data choke point, which can be relieved by the optical communication interface. Embodiments of the memory device with an optical interface can use the control logic to perform bus control operations using an optical clock and interferometry using interfering optical beams to accelerate data communication.

In some specific embodiments, the optical silicon interface can be operated by the control logic to increase data communication speed and reliability by constructing signals in the form of a sine-wave in a piece-wise manner, measuring segments above and below a base line and assigning digital values as 0 or 1 depending on wave position. Accordingly, formation of square wave signals is avoided, which attains benefits to heat dissipation, which is proportional to frequency squared.

In some embodiments, the memory device can include some memory that is unacceptable for standard processing but very inexpensive and thus may have some usefulness and cost-effectiveness in some operations. For example, a relatively fast but error-prone memory may be useful for video processing. In various applications, the basis of memory quality may vary, for example, error rate, speed, and the like.

Figure 3A:
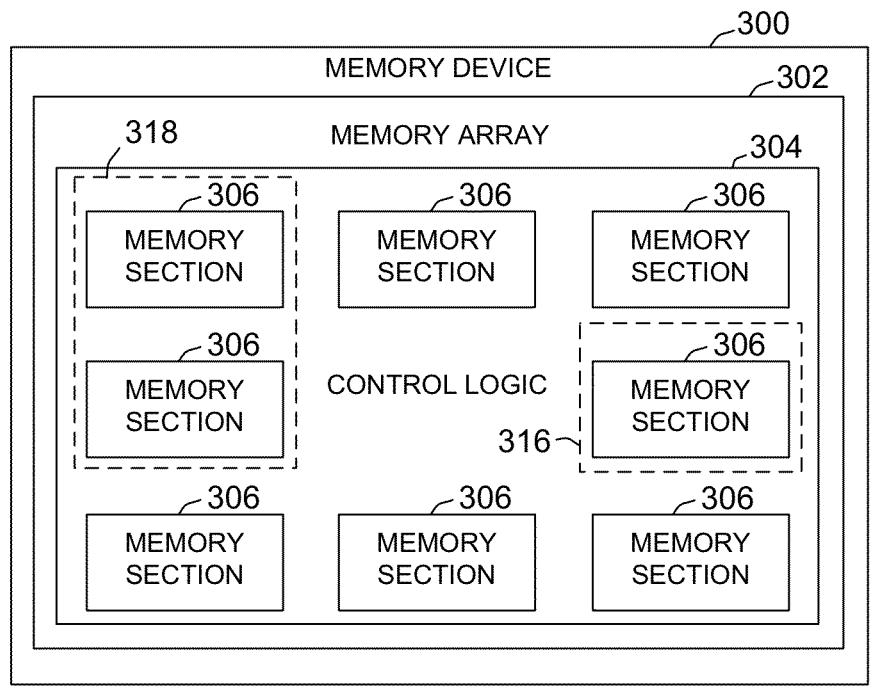
FIGS. 3A and 3B are schematic block diagrams illustrating respective top and side view of an embodiment of a memory device that is operable to facilitate engineering acceptable redundancy for loss-tolerant data via use of memories in variable magnetic field environments.
Figure 3B:
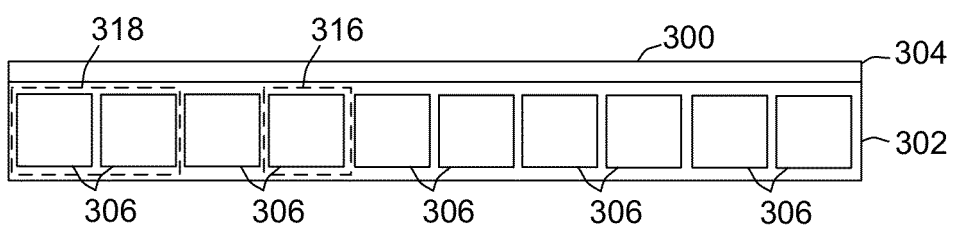

Referring to FIGS. 3A and 3B, schematic block diagrams illustrate respective top and side view of an embodiment of a memory device that is operable to facilitate engineering acceptable redundancy for loss-tolerant data via use of memories in variable magnetic field environments. The memory device 300 can be configured with the memory array 302 including in the plurality of memory sections 306 at least one memory section susceptible to failure due to a magnetic field condition 316 and at least one memory section resistant to the failure due to the magnetic field condition 318. The control logic 304 is operable to allocate the at least one memory section resistant to the failure due to the magnetic field condition 318 redundant to the at least one memory section susceptible to failure due to a magnetic field condition 316.

Figure 4A:
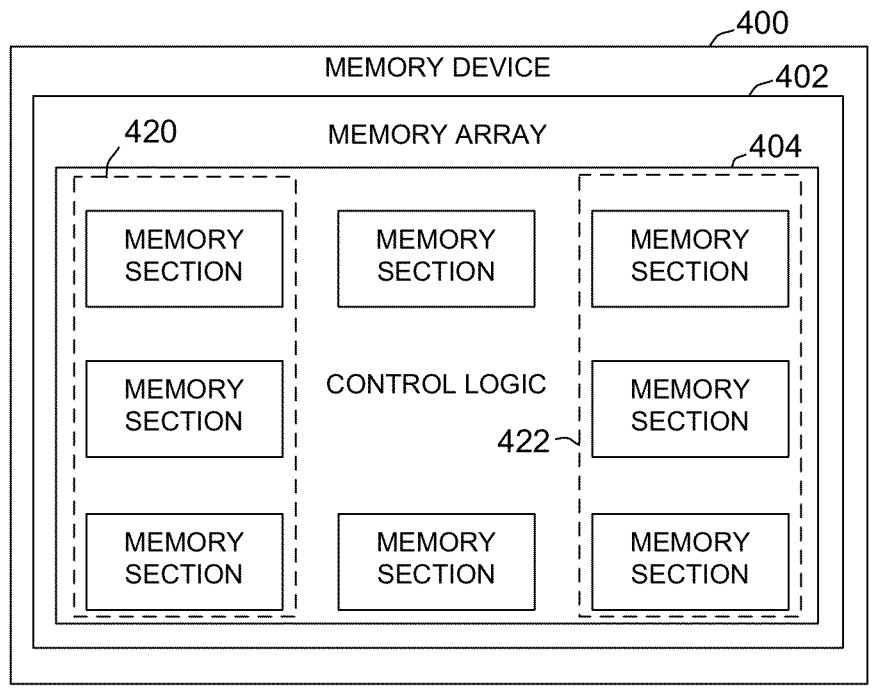
FIGS. 4A and 4B are schematic block diagrams showing respective top and side view of an embodiment of a memory device that is operable to facilitate engineering acceptable redundancy for loss-tolerant data via use of memories of different speed characteristics.
Figure 4B:
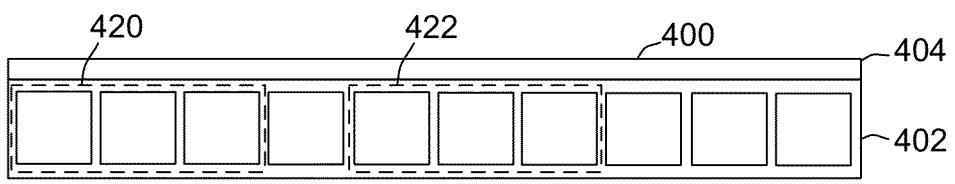

Referring to FIGS. 4A and 4B, schematic block diagrams show respective top and side view of an embodiment of a memory device that is operable to facilitate engineering acceptable redundancy for loss-tolerant data via use of memories of different speed characteristics. The memory device 400 can be configured with the memory array 402 including at least one memory section including fast memory 420 and at least one memory section including slow memory 422 that has slower access speed than the at least one memory section including fast memory 420. The control logic 404 can be operable to selectively allocate portions of the memory section including fast memory 420 and the memory section including slow memory 422 that are mutually redundant.

In some embodiments and/or applications, the memory device can be configured to allocate different portions of memory that have differing characteristics to specific applications. Some characteristics of memory can be better for some applications. For example, the control logic can assign data in high-speed operations to high-speed memory while assigning less time-critical applications to slower memory. The control logic can take into consideration memory speed when allocating redundant memory sections, for example maintaining sampled data from high-speed operations in relatively slow-speed memory. The control logic can assign frequently updated information to memory types that are more durable to writes. In another example application, the memory device can be used in an end-to-end image storage system which includes multiple types of memory including multiple types of non-volatile RAM. For example, the memory device can be used to supply inexpensive memory such as memory stripes that are not part of a device such as a picture telephone, but is used to accumulate data (such as pictures) using some mirror communications that are facilitated by intelligence supplied by the control logic. In an example application, the control logic can activate to perform data communication when the memory device is in a location sufficiently proximal to the picture telephone to enable data transfer. The control logic can be used to detect that the picture telephone and the memory device are sufficiently close to perform a data transfer and, if so, operate in a low operation, low power mode to perform the data communication. Accordingly, the intelligence of the control logic can enable data transmission when the memory is in any location that is sufficiently close to the data source.

Figure 5A:
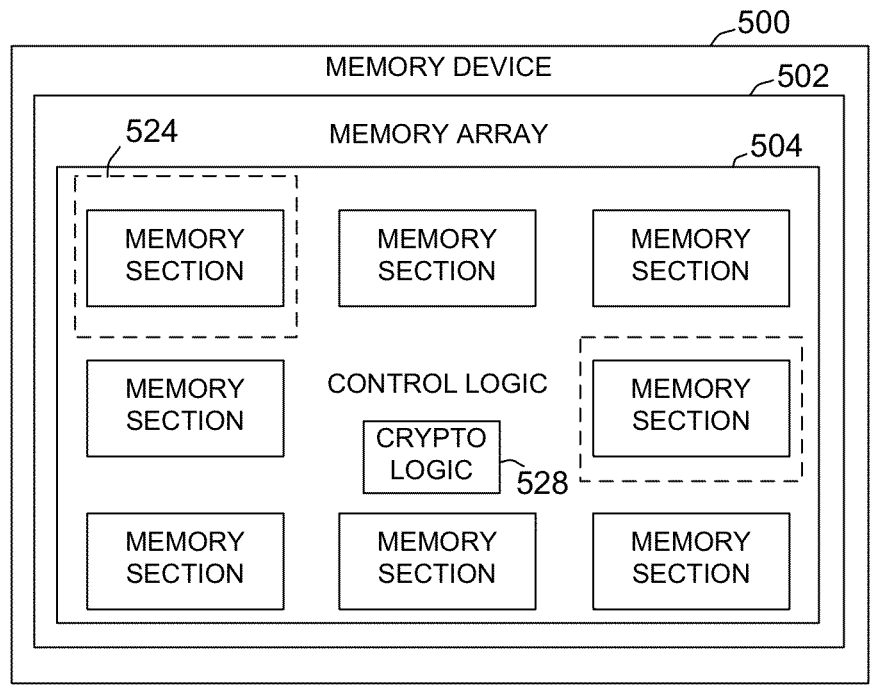
FIGS. 5A and 5B are schematic block diagrams depicting respective top and side view of an embodiment of a memory device that is operable to facilitate engineering acceptable redundancy for loss-tolerant data via use of cryptographic processing for redundant storage.
Figure 5B:
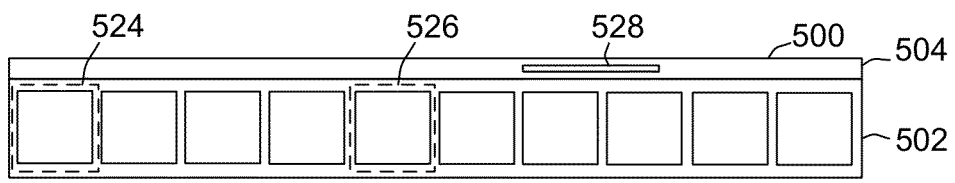

Referring to FIGS. 5A and 5B, schematic block diagrams depict respective top and side view of an embodiment of a memory device that is operable to facilitate engineering acceptable redundancy for loss-tolerant data via use of cryptographic processing for redundant storage. The memory device 500 can be configured with the memory array 502 including a first memory section 524 and a second memory section 526 that is redundant to the first memory section 524. The control logic 504 can be operable to represent data in the second memory section 526 as a hash of data in the first memory section 524. The control logic 504 can include a cryptographic processor or logic 528 to compute the hash function.

In certain applications and/or embodiments, the memory device 500 can be formed such that the memory array 502 includes a first memory section 524 and a second memory section 526 that is redundant to the first memory section 524. The control logic 504 can be operable to dump data in the first memory section 524 to the second memory section 526 at selected times.

Figure 6A:
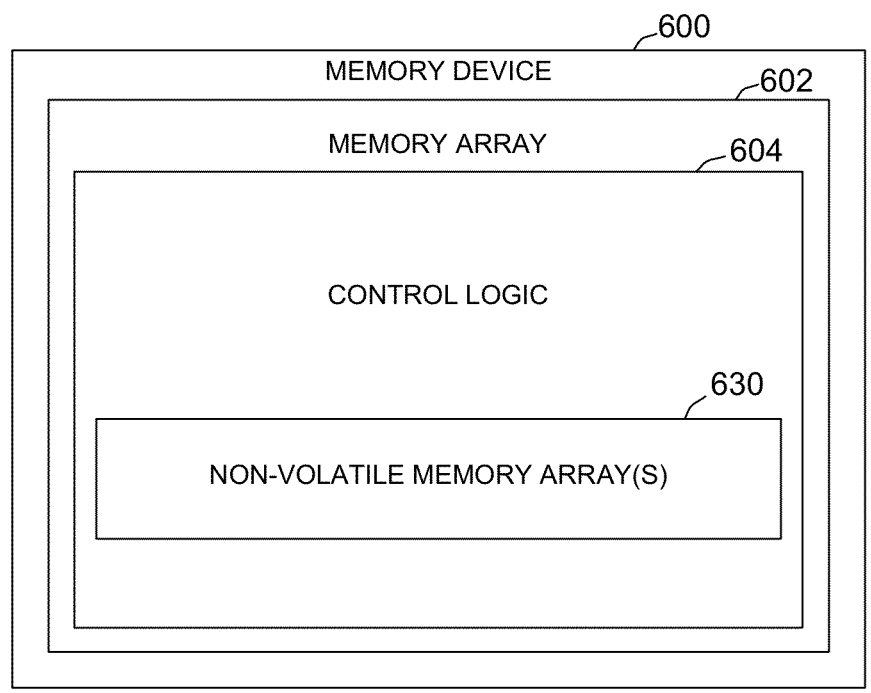
FIGS. 6A and 6B are schematic block diagrams illustrating respective top and side view of an embodiment of a memory device that is operable to facilitate engineering acceptable redundancy for loss-tolerant data via use of non-volatile memory.
Figure 6B:
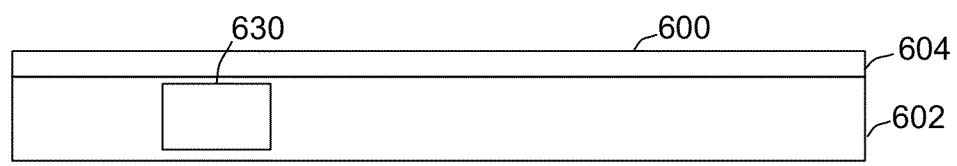

Referring to FIGS. 6A and 6B, schematic block diagrams illustrate respective top and side view of an embodiment of a memory device that is operable to facilitate engineering acceptable redundancy for loss-tolerant data via use of non-volatile memory. The memory device 600 can be configured with the memory array 602 including at least one redundant non-volatile memory array 630. The control logic 604 can be operable to dump data to the at least one redundant non-volatile memory array 630 at selected times.

Various techniques may be used for forming an integrated circuit with a combination of the non-volatile memory array and the control logic. In one example technique, an integrated circuit for a non-volatile memory cell transistor can be formed by constructing a layer of discrete storage cells over a substrate in two substrate regions, applying a dielectric layer over the layer of discrete storage cells in the two substrate regions, and building a barrier layer over the dielectric layer in the two regions. The barrier layer, dielectric layer, and the layer of discrete storage cells are then removed in one of the two substrate regions, leaving the layers intact in the other of the two substrate regions. An additional barrier layer is then formed over the substrate in the two substrate regions, then removed from the substrate region from which the barrier layer, dielectric layer, and the layer of discrete storage cells were previously removed. Two gates of a memory element are then formed respectively in the two substrate regions with one gate including a portion of the first barrier layer and another gate including a portion of the additional barrier layer. One aspect of fabricating a circuit that integrates the non-volatile memory array and the control logic on the memory device is selection of a suitable annealing process. For example, the illustrative integrated circuit can include a charge storage layer and a barrier layer formed over both a non-volatile memory region and a logic region. The charge storage layer can be formed of one or more layers and can include multiple discrete storage cells for storing charge which are isolated by a dielectric layer of insulating material with a suitably high dielectric constant. The charge storage layer can be constructed by depositing and annealing the discrete storage cells (for example, one or more of a silicon material such as polysilicon, silicon carbide, or the like, or a suitable metal such as germanium) on a dielectric area. The thermal annealing action can be performed by rapid thermal annealing (RTA) or a slower annealing process such as laser spike annealing (LSA). Memory properties can be selected and controlled by optimizing the annealing condition, thereby resulting in an improved reliability, write durability, and failure resistance.

In another example technique for forming an integrated circuit with a combination of the non-volatile memory array and the control logic, a non-volatile memory cell with improved charge retention on a substrate common with logic devices using a single-gate logic process in which a silicide-blocking dielectric barrier is formed over a floating gate of a non-volatile memory cell so that silicide cannot be formed over the floating gate but is formed over logic devices, thereby preventing bridging and silicide spiking in the non-volatile memory cell. The silicide-blocking dielectric barrier prevents silicide metal from contacting the floating gate or sidewall spacers while allowing the silicide metal in parts of active regions of the non-volatile memory cell at locations removed from the floating gate and spacers. The silicide regions can be constructed by initially depositing a refractory metal layer over the surface of the non-volatile memory cell, followed by a reactive anneal which causes the metal layer to react with the underlying contacted silicon regions to form silicide regions. A metal strip removed unreacted portions of the metal layer but leaves the silicide regions which are formed by a logic process using metals such as titanium, cobalt, nickel, or the like. A relatively slow annealing process can be used to produce suitable memory performance.

In a further example technique for forming an integrated circuit with a combination of the non-volatile memory array and the control logic, a scalable, logic transistor can be constructed with drain and source formed as a pair of doped regions and a gate insulator layer formed over the substrate and between the drain and source. A gate stack can include a gate layer (polysilicon or metal) between two metal nitride layers. A non-volatile memory transistor that is compatible with the logic transistor can be added via a high-K dielectric constant film with an embedded metal nano-dot layer between a tunnel insulator and the gate stack. The drain and source doped regions can be n+ regions doped into a p-type substrate to form an n-channel Field Effect Transistor (FET) device. The diffusion regions can be formed using n-F doped amorphous silicon, followed by an anneal such as a rapid thermal anneal (RTA) to reduce thermal budget and silicidation. A p-channel FET can similarly be formed via p+ diffusion source/drain regions applied over an n-well region. In other embodiments, annealing can be performed using a slow annealing process to improve memory performance and write durability while reducing stress and defects.

In an additional example technique for forming an integrated circuit with a combination of the non-volatile memory array and the control logic, non-volatile memory process steps can be added to a processor for forming high-voltage complementary metal-oxide semiconductor (CMOS) devices. The fabrication technique can include formation of isolation areas for the non-volatile memory and the high-voltage CMOS elements, forming high thermal drive process elements of both the memory and CMOS cells, forming mid thermal drive process elements of the logic CMOS cells, and forming low thermal process elements for logic CMOS, non-volatile memory, and high-voltage CMOS cells. Dopants for forming the devices can include masked implantation of boron, phosphorus and other species and subsequent annealing of the dopings, for example, using a slow annealing process to enhance charge retention in the memory devices.

The non-volatile memory can be formed of one or more of any non-volatile memory type or technology including read-only memory, flash memory, ferroelectric random access memory (F-RAM), magneto-resistive RAM (M-RAM) or the like.

Figure 7A:
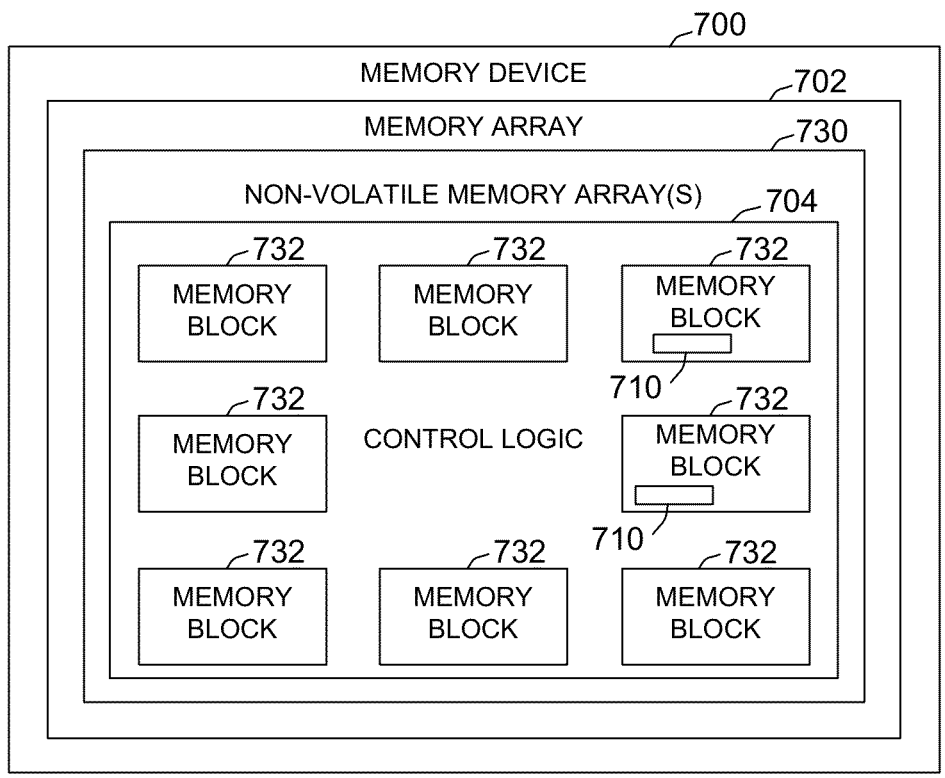
FIGS. 7A and 7B are schematic block diagrams showing respective top and side view of an embodiment of a memory device that is operable to facilitate engineering acceptable redundancy for loss-tolerant data via use of multiple memory blocks with different operating characteristics.
Figure 7B:
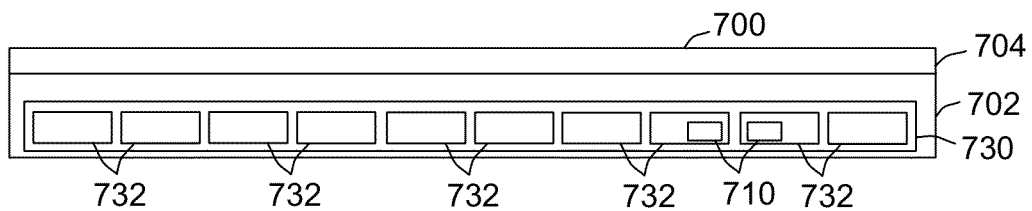

Referring to FIGS. 7A and 7B, schematic block diagrams show respective top and side view of an embodiment of a memory device that is operable to facilitate engineering acceptable redundancy for loss-tolerant data via use of multiple memory blocks with different operating characteristics. Accordingly, the memory device 700 can be configured in which the memory array 702 includes at least one non-volatile memory array 730 including a plurality of memory blocks 732 characterized by a plurality of different operating characteristics. The control logic 704 can be operable to selectively manage redundant sections 710 in the plurality of memory blocks 732 based on at least one of the a plurality of different operating characteristics.

In various embodiments, the memory device can include multiple types of memory technology, for example including charge memory or resistive memory. A memory device can include sections of charge memory and resistive memory and the control logic can assign applications to exploit the advantages and diminish the consequences of disadvantages of either type of memory. Charge memories induce a voltage which is detected during read operations in response to require amounts of charge. In nonvolatile storage, flash memories precisely control the discrete charge placed on a floating gate. In volatile storage, DRAM not only places charge in a storage capacitor but also mitigate subthreshold charge leakage through the access device using capacitors that are sufficiently large to store charge for reliable sensing and using transistors that are sufficiently large to exert effective control over the channel. Resistive memories use electrical current to induce a change in atomic structure, changing the resistance detected during reads. Resistive memories are more suitable for scaling than charge memories by avoiding precise charge placement and control. Programming via techniques such as current injection scale with cell size. Phase-change memory (PCM), spin-torque transfer (STT) magneto-resistive RAM (M-RAM), and ferroelectric RAM (FRAM) are examples of resistive memories.

Some embodiments of the memory device depicted in FIGS. 7A and 7B, the memory device 700 can be formed such that the memory array 702 includes at least one non-volatile memory array 730 including a plurality of memory blocks 732 characterized by a plurality of different operating characteristics. The control logic 704 is operable to analyze memory accesses and selectively manage redundant sections 710 in the plurality of memory blocks 732 based on the analysis.

For example, the control logic can access, if available, background information about data characteristics and applications to tailor the memory to the currently-executing application.

In some embodiments, the memory device can include control logic that is configured to monitor current patterns in the memory and analyze using entropy laws, for example by determining the fluctuations in data using statistical mechanics techniques. The control logic can monitor memory accesses and determine the relative probability that the entropy of the data is currently outside an equilibrium level and so the data is expected to be characterized by increases or decreases over time. The entropy of an isolated system is expected to increase until reaching equilibrium.

In various embodiments, the memory device can include a non-volatile memory array which includes one or more suitable memory technology. For example, memory technologies in the memory device can include embedded flash, read-only memory (ROM), electrical fuse (one-time programmable), CMOS floating gate (multiple time programmable), CMOS floating gate (one-time programmable), and anti-fuse (one-time programmable). The different memory technologies can have various advantages and disadvantages for particular operations or applications. Some memory technologies can have relatively high density such as ROM and antifuse, while others have low density (for example electrical fuse and CMOS floating gate). Some technologies have good endurance such as embedded flash, and CMOS floating gate, while others have poor endurance, for example ROM, electrical fuse, CMOS floating gate, and antifuse. Various technologies can have different standby and active current including high current (electrical fuse), medium current (embedded flash and CMOS floating gate), and low current (ROM and antifuse). The memory technologies vary in random access time including fast (ROM and antifuse), medium (embedded flash and CMOS floating gate), and slow (electrical fuse). The memory technologies vary in security including high security (antifuse), medium security (embedded flash and CMOS floating gate), and slow security (ROM and electrical fuse). The memory technologies vary in high and low temperature and voltage tolerance including high tolerance (ROM and antifuse), medium tolerance (electrical fuse), and low tolerance (embedded flash and CMOS floating gate). In a memory device that includes multiple memory sections with more than one memory technology, the control logic can monitor a history and pattern of memory accesses and assign memory usage depending on the monitoring. For data or code that changes very frequently, the control logic can assign embedded flash. For high volume storage, the control logic can assign more dense memory technologies. For applications in which the code changes infrequently, the control logic can allocate, for example, ROM and antifuse. The control logic can assign memory accesses depending on temperature and voltage conditions that can be measured using sensors or otherwise communicated to the memory device. The control logic can determine the security level of an application and assign the memory technology accordingly.

In several embodiments and/or applications of the memory device depicted in FIGS. 7A and 7B, the memory device 700 can be configured with the memory array 702 including at least one non-volatile memory array 730 including a plurality of memory blocks 732 characterized by a plurality of different operating characteristics. The control logic 704 is operable to analyze memory accesses, determine application constraints based on the analysis, and selectively manage redundant sections 710 in the plurality of memory blocks 732 based on the determined application constraint.

In some embodiments, the memory device can include control logic that write-protects a selected location, block, or portion of memory. Subsequent erroneous write to the protected area can activate the control logic to perform predetermine handling such as repairing an error, performing an exit and restart, generating an error report, or the like.

Some embodiments of the memory device depicted in FIGS. 7A and 7B, the memory device 700 can be formed with the memory array 702 including at least one non-volatile memory array 730 with a plurality of memory blocks 732 characterized by a plurality of different operating characteristics. The control logic 704 can be operable to analyze memory accesses, determine priority of performance based on the analysis, and selectively manage redundant sections 710 in the plurality of memory blocks 732 based on the determined priority of performance.

The memory device can, in addition to including multiple types of memory, can include multiple different classes of memory of the same memory type to attain a desired operating characteristic. The different classes of memory may include memory of the same technology with different operating parameters or different fabrication process parameters. The different classes of memory may be formed with different polysilicon types, different metal types, different silicides or salicides, various source, gate, and spacer dimensions, different annealing processes, and any other suitable variation in fabrication technique.

In additional embodiments and/or applications of the memory device depicted in FIGS. 7A and 7B, the memory device 700 can be constructed such that the memory array 702 includes at least one non-volatile memory array 730 including a plurality of memory blocks 732. The control logic 704 is operable to analyze memory accesses, perform error detection based on the analysis, characterize Quality-of-Service (QoS) ratings of the plurality of memory blocks 732 based on the performed error detection, and selectively manage redundant sections 710 in the plurality of memory blocks 732 based on the characterized QoS ratings. For example, the control logic can determine and use QoS ratings, and assign priority of performance to sections of memory. For relatively high performance applications, the device may be configured to work perfectly and the control logic can specify that only highly reliable memory is used. The control logic can perform an error detection operation and determine whether too many errors are occurring according to a predetermined threshold and, if so, the control logic can shift to higher performing memory. The control logic can start an application with a determined QoS rating and monitor errors to iteratively select an appropriate memory segment that is tailored to application characteristics and performance.

For other example embodiments, the control logic can allow less-than-perfect performance for suitable applications and/or contexts. The control logic can determine and use QoS ratings for processor in memory (POM), and assign priority of performance to sections of memory. For relatively high performance applications, the device may be configured to work perfectly and the control logic can specify that only highly reliable memory is used. Other applications can operate at a lower QoS and the control logic can select memory accordingly.

The non-volatile memory array can include memory portions formed of memory technologies characterized by high performance under particular operating conditions. Phase change RAM (PCRAM) is a memory technology with highly favorable small cell size and thus density. The memory device which includes at least a portion of PCRAM can further include control logic that monitors and determines operating conditions and can assign memory accesses to PCRAM in low power high performance conditions.

Other examples of non-volatile memory technologies with various QoS ratings can include resistive RAM (R-RAM) and spin-transfer torque RAM (STT-RAM). R-RAM can be any memory technology that relies of resistance change to store information, for example including space-charge-limited-current (SCLC), filament, programmable-metallization-cell (PMC), Schottkey contact and traps (SCT). R-RAM can be characterized by non-volatility, high-speed, high-performance, zero standby power, and, in some arrangements, high density. For a memory device that includes at least a portion of the memory in the form of R-RAM, the control logic can monitor memory accesses and determine whether a particular application is characterized by high-speed and high-performance, and assign the R-RAM memory portion for the application.

In another example application, a memory device can include a non-volatile memory array and includes at least a portion of the memory in the form of STT-RAM. STT-RAM can be characterized by improved performance via overdriving. Overdriving the gate voltage of an NMOS transistor in the STT-RAM can increase $V_{GS}$ and thus enhance the driving strength of the NMOS transistor. The control logic can be configured to manage overdriving, for example, by monitoring memory access operations such as reading, writing, erasing, driving write-line voltage, and the like, and control overdriving according to the particular application.

In further embodiments of the memory devices depicted in FIGS. 7A and 7B, the memory device 700 can be arranged such that the memory array 702 includes at least one non-volatile memory array 730 including a plurality of memory blocks 732. The control logic 700 is operable to receive a report on operating conditions of system performance at system bootstrap loading, and selectively manage redundant sections 710 in the plurality of memory blocks 732 based on the report. An operation at bootstrap loading can cause the system to report on the operating condition of all components (including all chunks of memory) to enable allocation of functionality based on performance of the components.

In a particular application, the memory device can include control logic that restores a persistent application state by mapping non-volatile memory pages across system reboot operations, for example by mapping non-volatile RAM pages in different processes including processes that are not necessarily concurrent. The control logic can also support access control in portions of the non-volatile RAM in the manner of file system access control.

In some applications, what is desired is a capability to store large amounts of data while allowing some amount of inaccuracy or error. Such an application can be video streaming. The memory device can thus be formed with at least a portion of the memory that is very inexpensive but very lossy.

In additional embodiments of the memory device depicted in FIGS. 7A and 7B, the memory device 700 can be configured to manage redundancy to improve write endurance. Accordingly, the memory device 700 can be formed and operated such that the memory array 702 includes at least one non-volatile memory array 730 including a plurality of memory blocks 732. The control logic 704 is operable to monitor writes to the plurality of memory blocks 732 of the non-volatile memory array 730, and selectively manage redundant sections 710 in the plurality of memory blocks 732 based on results of the monitoring.

One problem inherent to non-volatile memory is failure that results from multiple writes to a memory element. The control logic can operate to suitably allocate and distribute writes to non-volatile memory cells to avoid or prevent failure, for example by shifting through memory as particular cells are written or by allocating newer or less-written memory to operations, applications, or contexts characterized by a requirement for higher accuracy.

In an example embodiment, the memory device can include control logic can allocate writes according to memory type. For example, the memory device can include a section of PCRAM. Writes can result in substantial wear in PCRAM. When current is injected into a volume of phase-change material, thermal expansion and contraction degrade the electrode storage contact, resulting in programming currents injected into the memory cell that are insufficiently reliable. PCRAM material resistivity is highly dependent on current injection so that current variability leads to resistance variability, degrading the read window of suitable programmed minimum and maximum resistances. Accordingly, the control logic and monitor and determine applications characterized by repeated and enduring writes, and allocate such applications to memory segments other than PCRAM segments.

A memory device can be configured with control logic that is operable to mitigate wear and energy. For example, PCRAM, which is susceptible to wear and failure for high levels of writing to a PCRAM cell over a memory lifetime, can be managed using mitigation techniques of write reduction and leveling to improve PCRAM endurance. In a particular operation, the control logic can allocate some memory to function as a cache and track written cache lines and written cache words to implement partial writes and reduce wear. In another technique, the control logic can monitor writes to eliminate redundant bit writes. In a typical memory access, a write updates an entire row of memory cells, many of which are redundant. The control logic can remove the redundant bit writes and thereby substantially increase memory lifetimes, for example by preceding a write with a read and compare. Following the read, an XNOR gate can be used to filter redundant bit-writes. A PCRAM read is sufficiently faster than a PCM write and writes are less latency critical, so the performance reduction from reading before a write is in consequential.

In some embodiments and/or applications, the control logic can allocate instruction cache and data cache depending on the application and environment. In further arrangements, the control logic can also select physical locations of memory depending on application and operating environment.

In addition to eliminating redundant writes, the control logic can also improve write wear performance by row shifting. After removing redundant bit writes, bits most written in a row tend to be localized so that the control logic can perform simple shifting to more evenly distribute writes within a row.

The control logic can attain additional wear improvement by segment swapping in which memory segments of high and low write accesses are periodically swapped. The control logic can track write counts and manage a mapping table between segments.

In another example embodiment, the memory device can include control logic operable to allocate memory according to wear such as by limiting the frequency of allocation for a particular memory block and by maintaining frequently changing metadata in DRAM that is separate from managed blocks of non-volatile memory.

Embodiments of the memory device can perform wear-leveling via managed allocation. For example, the control logic can avoid allocation of a newly released memory block but rather time-stamp the block and add the block to a first-in-first-out queue. On subsequent allocations or releases, the control logic can examine the block at the head of the queue and, if resident on the queue for a sufficient time, can remove the block from the queue and mark eligible for re-allocation. The control logic can maintain list pointers in headers and footers of freed blocks and update the list pointers when adjacent free blocks are merged into a larger free region. In another technique, the control logic can track the allocated or free state of memory blocks using a DRAM bitmap and manage the bitmap dynamically during operations.

In additional embodiments, the memory device 700 can be configured such that the memory array 702 includes at least one non-volatile memory array 730 including a plurality of memory blocks 732. The control logic 704 can be operable to monitor operating characteristics of the memory device 700, analyze the monitored operating characteristics, detect a precursor to a memory failure based on the analysis, and selectively manage redundant sections 710 in the plurality of memory blocks 732 based on the detected precursor.

Thus, the control logic can be operable to perform maintenance operations of the memory in response to physical phenomena imposes on the memory. For example, the memory device can incorporate sensors or other components that detect phenomena which can be monitored by the control logic to detect magnetic fields, electrical conditions, temperature, and the like to enable the control logic to perform actions to maintain, repair, clean, or other operations applied to the memory.

In other embodiments and/or applications of the memory device depicted in FIGS. 7A and 7B, the memory device 700 can be arranged with the memory array 702 including at least one non-volatile memory array 730 including a plurality of memory blocks 732. The control logic 704 can be operable to access a time signal, monitor memory accesses referenced by the time signal, analyze workload based on the monitored memory accesses, and selectively manage redundant sections 710 in the plurality of memory blocks 732 based on the analyzed workload.

For example, the memory device can include control logic that takes into consideration that, at different times, the loads are expected to be different for management of redundant memory blocks. In a particular instance, the memory device may be used in a data center in which some of the activity is work-related, and other activity is recreational. The control logic can be configured to allocated different types of memory accordingly, for example to handle volumes of streaming video and audio content during non-working hours.

Figure 8A:
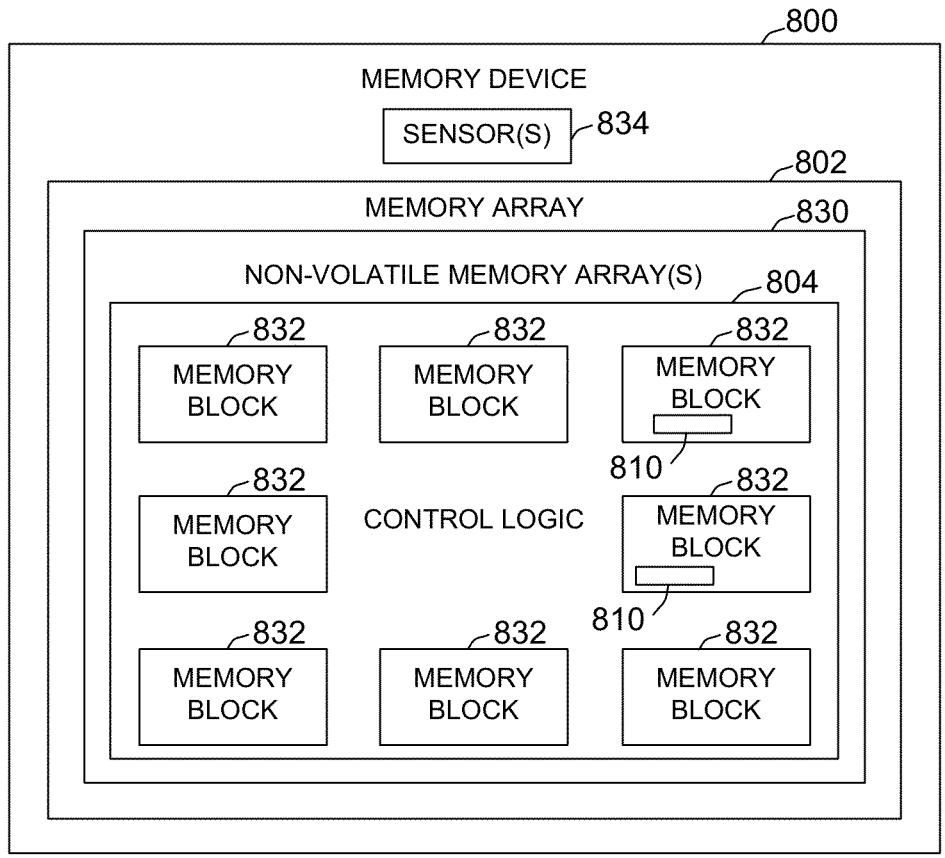
FIGS. 8A and 8B are respective top and side views of schematic block diagrams illustrating embodiments of a memory device that is operable to facilitate engineering acceptable redundancy for loss-tolerant data via use of memories using control logic that uses one or more sensors integrated with the memory device to facilitate management of the memory.
Figure 8B:
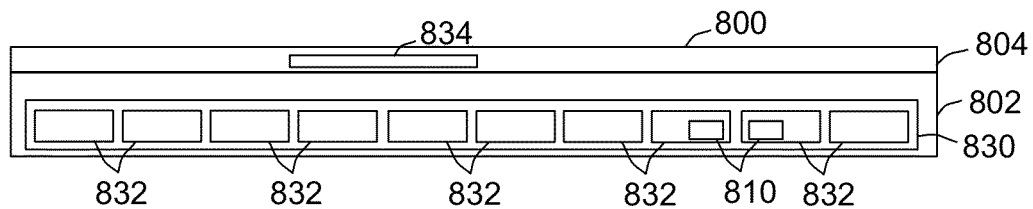
Figure 9A:
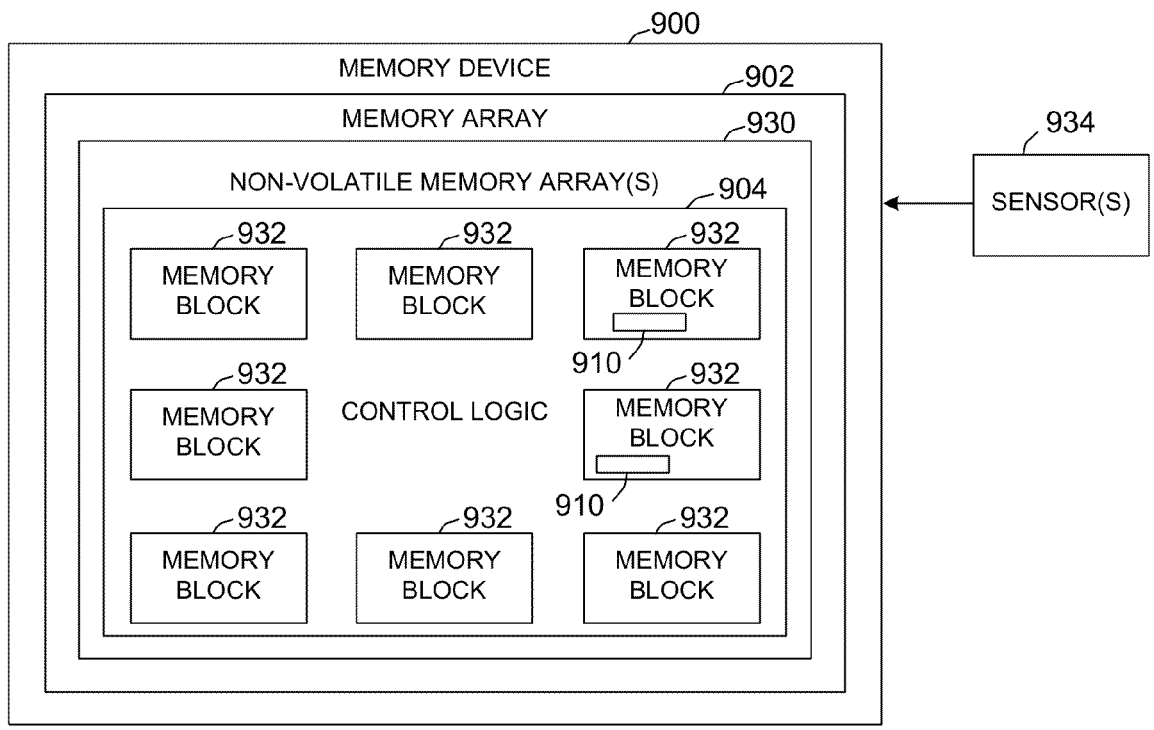
FIGS. 9A and 9B are respective top and side views of schematic block diagrams showing embodiments of a memory device that is operable to facilitate engineering acceptable redundancy for loss-tolerant data via use of memories using control logic that uses one or more sensors external to the memory device to facilitate management of the memory.
Figure 9B:
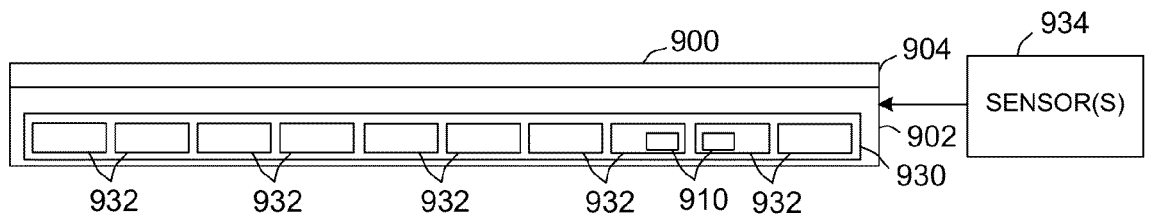

Referring to FIGS. 8A and 8B, respective top and side views of schematic block diagrams illustrate embodiments of a memory device that is operable to facilitate engineering acceptable redundancy for loss-tolerant data via use of memories using control logic that uses one or more sensors integrated with the memory device to facilitate management of the memory. Referring to FIGS. 9A and 9B, respective top and side views of schematic block diagrams show embodiments of a memory device that is operable to facilitate engineering acceptable redundancy for loss-tolerant data via use of memories using control logic that uses one or more sensors external to the memory device to facilitate management of the memory. Various embodiments of the memory device 800, 900 can further include at least one sensor 834, 934 operable to detect an operating condition. The memory array 802, 902 can include at least one non-volatile memory array 830, 930 including a plurality of memory blocks 832, 932. The control logic 804, 904 is operable to monitor the operating condition, analyze the monitored operating condition, detect a precursor to a memory failure based on the analysis, and selectively manage redundant sections 810, 910 in the plurality of memory blocks 832, 932 based on the detected precursor.

The memory device can include any suitable sensor for detecting a condition that may be useful for allocate memory usage. Example sensors can measure voltage, current, capacitance, resistance, capacitive/resistive, and other electrical or magnetic phenomena. Other suitable sensors can sense touch, tactile phenomena, pressure, vibration, gyro, inertia, angular velocity, and the like. Some sensors can sense ionic, optical, electrochemical, infrared, temperature, and the like.

In an embodiment of a memory device that includes multiple memory types or technologies, the sensor can detect electrical characteristics such as voltage or current and the control logic can determine whether the energy drive is sufficient to drive the memory reliably. If the energy drive is insufficient for a particular type of memory, the control logic can shift memory accesses to a memory type that can be reliably driven.

In some embodiments, a memory device can be configured to allocate memory for a particular application or operation based on scalability, for example by determining whether a substantial number of storage cells is to be used. For example, the memory device can be formed to store a redundant memory section in a decreased feature size to reduced overall storage footprint. PCRAM can be a highly scalable memory technology since thermal resistivity increases, contact area decreases, and the volume of phase-change material to block current flow decreases with feature size. As feature size becomes smaller, contact area decreases quadratically, and reduced contact area causes resistivity to increase linearly, causing programming current to decrease linearly. Thus PCRAM can attain not only smaller storage elements but also smaller access devices for current injection, leading to lower memory subsystem energy. Thus, the control logic can allocate PCRAM segments to applications characterized by large memory use and density.

In other embodiments and/or applications of the memory devices depicted in FIGS. 8A, 8B, 9A, and 9B, the memory device 800, 900 can include at least one sensor 834, 934 operable to detect an operating condition. The memory array 802, 902 includes at least one non-volatile memory array 830, 930 including a plurality of memory blocks 832, 932. The control logic 804, 904 is operable to monitor the operating condition, analyze the monitored operating conditions, predict expected outcomes based on the analysis of the monitored operating conditions, and selectively manage redundant sections 810, 910 in the plurality of memory blocks 832, 932 based on the predicted expected outcomes.

In a particular application, the memory device can include control logic configured to predict different possible outcomes, for example predicting several possible outcomes and preparing for each, then use sensors, measurements, and monitoring to determine which outcome to activate at a particular time.

The memory device can include control logic that facilitates accessing of memory based on a determination of the type of operations being performed. For example, the control logic can detect high traffic in video streaming and modify data handling to shift from 16-bit byte memory accesses to accessing of blocks of data. For cloud computing applications which are limited by bandwidth, the control logic in the locally-controlled memory device can push all physical parameters off an external processor into the memory device, avoiding the bandwidth limitation and enabling additional memory-local capability including potentially different error correction algorithms. The memory device can thus enable a large scale memory with local control, such as a video memory with frame buffers or a dedicated image memory.

The control store can be configured to enable new operations. For example, the control logic can be configured to facilitate efficient memory accesses. In a particular example, the control logic can support a particular type of special image store which stores information of a particular size and form efficiently in memory, that writes different memory elements concurrently to a value that is suitable according to characteristics of the incoming image data. Special instructions can be used that can efficiently perform transforms on the image data.

In a particular embodiment, the memory device can include the non-volatile memory array which is inexpensive and can be maintained in close proximity to other types of memory either internal to the memory device or in a nearby integrated circuit chip. The control logic can be configured to perform bit-error correction by maintaining multiple copies of data in the high capacity enabled by non-volatile memory arrays, rather than the bit-checks of other error correction techniques. The multiple copies of data in the non-volatile memory can be used to occasionally detect errors using the multiple data copies. Accordingly, the memory device can include a relatively high capacity non-volatile memory array with high capacity and control logic operable to perform error correction. The high capacity in non-volatile memory can be used for error detection and correction in which redundant data is held in the non-volatile memory for error correction in the form of multiple data copies to enable recovery by the receiving memory even when a number of errors up to the capability of the code in use are introduced during transmission or on storage. Errors can be corrected without requesting retransmission by the sender.

In some embodiments and/or applications of the memory devices depicted in FIGS. 8A, 8B, 9A, and 9B, the memory device 800, 900 can include at least one sensor 834, 934 operable to detect an operating condition. The memory array 802, 902 can include at least one non-volatile memory array 830, 930 including a plurality of memory blocks 832, 932. The control logic 804, 904 is operable to monitor the operating condition, monitor memory accesses, analyze the monitored operating conditions and memory accesses, predict expected outcomes based on the analysis of the monitored operating conditions and memory accesses, and selectively manage redundant sections 810, 910 in the plurality of memory blocks 832, 932 based on the predicted expected outcomes.

Figure 10A:
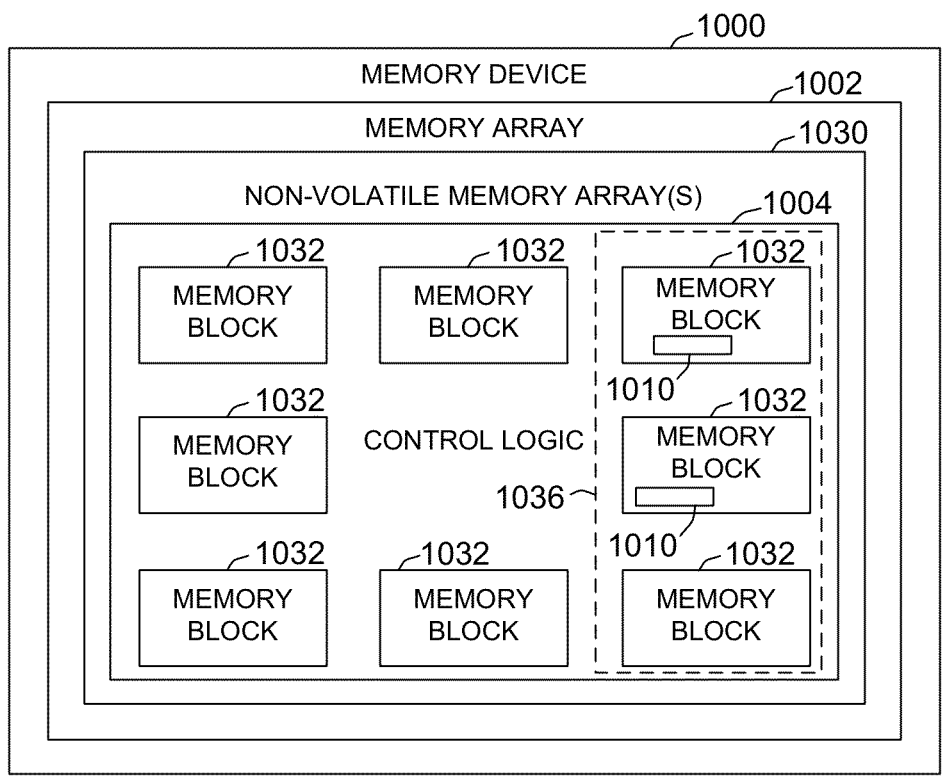
FIGS. 10A and 10B are respective top and side views of schematic block diagrams illustrating embodiments of a memory device that is operable to facilitate engineering acceptable redundancy for loss-tolerant data via use of memories using control logic that manages memory including at least a portion of the memory in the form of lossy memory.
Figure 10B:
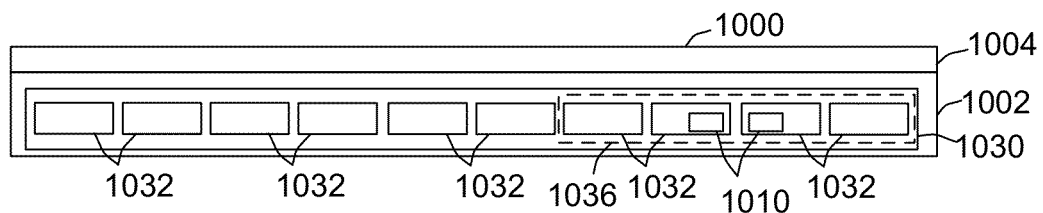

Referring to FIGS. 10A and 10B, respective top and side views of schematic block diagrams illustrate embodiments of a memory device that is operable to facilitate engineering acceptable redundancy for loss-tolerant data via use of memories using control logic that manages memory including at least a portion of the memory in the form of lossy memory. In some embodiments and/or applications, the memory device 1000 can further have a memory array 1002 including at least one non-volatile memory array 1030 including a plurality of memory blocks 1032 including at least one memory block including lossy memory 1036. The control logic 1004 can be operable to monitor memory accesses, analyze the memory accesses to determine instructions and data indicative for storage in the at least one memory block including lossy memory 1036, and selectively manage redundant sections 1010 in the plurality of memory blocks 1032 including lossy memory 1036.

Figure 11A:
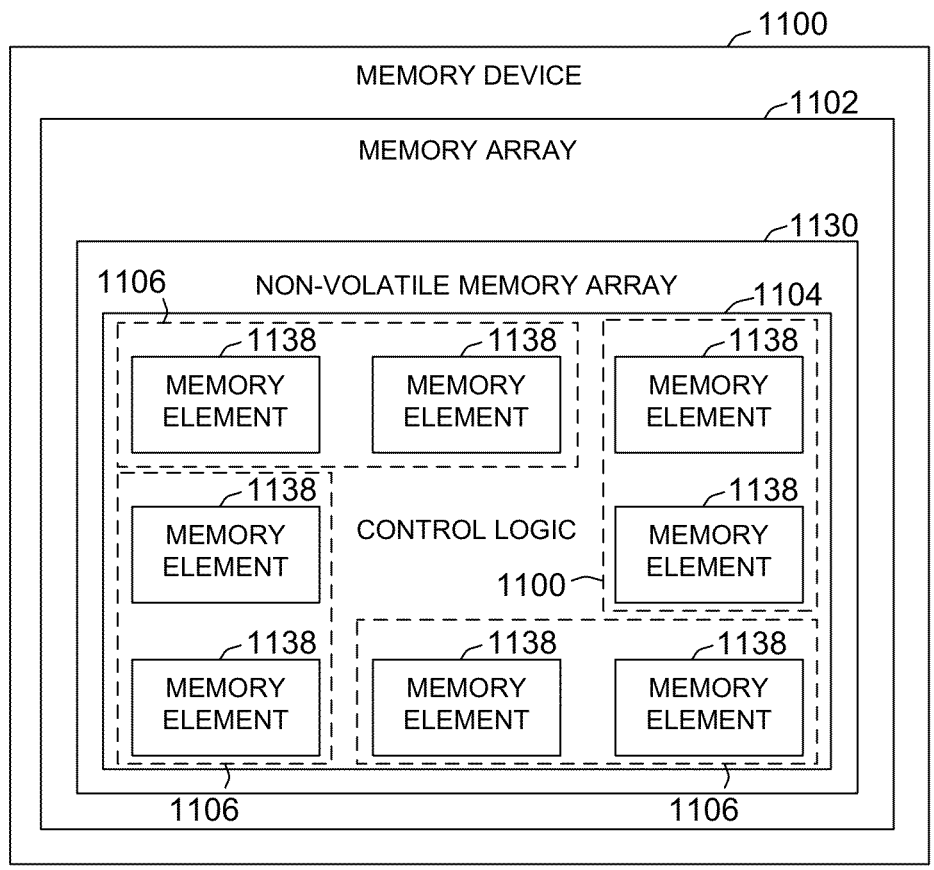
FIGS. 11A and 11B are schematic block diagrams depicting top and side views of embodiments of a memory device that is operable to facilitate engineering acceptable redundancy for loss-tolerant data via monitoring of writes to memory elements.
Figure 11B:
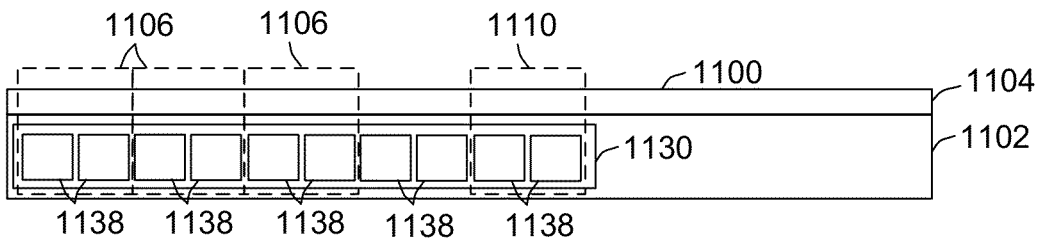

FIGS. 11A and 11B are schematic block diagrams depicting top and side views of embodiments of a memory device that is operable to facilitate engineering acceptable redundancy for loss-tolerant data via monitoring of writes to memory elements. For example, the memory device 1100 can be configured and operated such that the memory array 1102 includes at least one non-volatile memory array 1130 including a plurality of memory elements 1138. The control logic 1104 is operable to monitor writes to the plurality of memory elements 1138 of the non-volatile memory array 1130, and allocate as redundant sections 1110 ones of the plurality of memory sections 1106 characterized by write endurance.

In some embodiments and/or applications, the memory array includes a non-volatile memory array. Accordingly, the memory device 1100 can be arranged with a memory array 1102 including at least one non-volatile memory array 1130 including a plurality of memory elements 1138. The control logic 1104 can be operable to monitor writes to the plurality of memory elements 1138 of the non-volatile memory array 1130, and allocate as redundant sections 1110 ones of the plurality of memory sections 1106 that have a history of fewer writes.

In an example arrangement, the memory device can include memory of two types, such as non-volatile RAM (NVRAM) and DRAM in combination with control logic that allocates memory accesses for the NVRAM. The control logic prevents frequent reuse of memory locations and stores frequently-changing metadata in DRAM. The control logic can also add checksums to detect and correct corruption.

In embodiments adapted to promote write durability, the memory device can include a non-volatile memory array with multiple types of memory including at least one portion of memory characterized by elevated write endurance. In a particular embodiment, the non-volatile memory array can include at least on portion formed of M-RAM which is based on a tunneling magneto-resistive (TMR) effect. The individual M-RAM memory cells include a magnetic tunnel junction (MTJ) which can be a metal-insulator-metal structure with ferromagnetic electrodes. A small bias voltage applied between the electrode causes a tunnel current to flow. The MTJ is exposed to an external magnetic field and forms a hysteresis loop with two stable states, corresponding to 0 and 1 data states at zero magnetic field. M-RAM is characterized among non-volatile memory technologies as having excellent write endurance with essentially no significant degradation in magneto-resistance or tunnel junction resistance through millions of write cycles. Accordingly, the control logic can monitor and determine whether a particular application or process is characterized by frequent, enduring write operations and assign a portion of M-RAM to handle memory accesses.

Another memory technology characterized by write endurance is ferroelectric RAM (FeRAM). FeRAM can be constructed using material such as lead-zirconate-titanate (PZT), strontium-bismuth-tantalate (SBT), lanthanum substituted bismuth-tantalate (BLT), and others. An externally applied electric field causes polarization of the FeRAM material to be switched and information retained even upon removal of the field. In absence of the electric field, polarization has two distinct stable states to enable usage in memory storage. FeRAM can have write endurance at the level of M-RAM and is further characterized by a reduced cell size and thus higher density. Thus, the control logic can monitor and determine whether a particular application or process is characterized by frequent, enduring write operations in combination with a relatively large number of storage cells. The control logic can assign a portion of FeRAM to handle memory accesses.

Figure 12A:
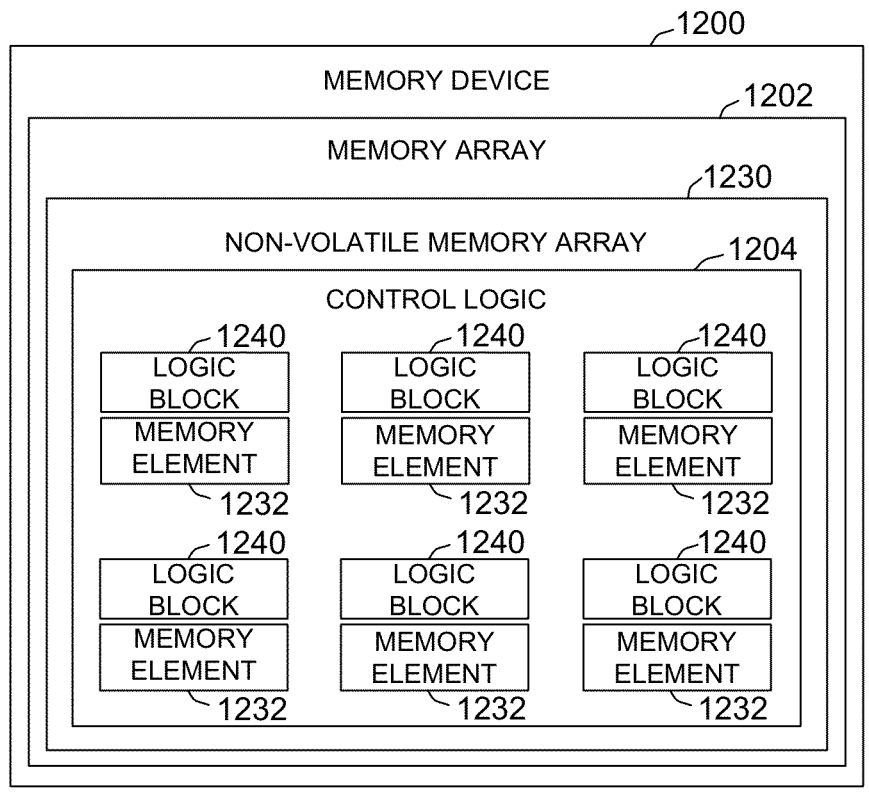
FIGS. 12A and 12B are respective top and side views of schematic block diagrams illustrating embodiments of a memory device that is operable to facilitate engineering acceptable redundancy for loss-tolerant data using control logic that is distributed in memory with multiple command logic blocks associated with multiple memory elements.
Figure 12B:
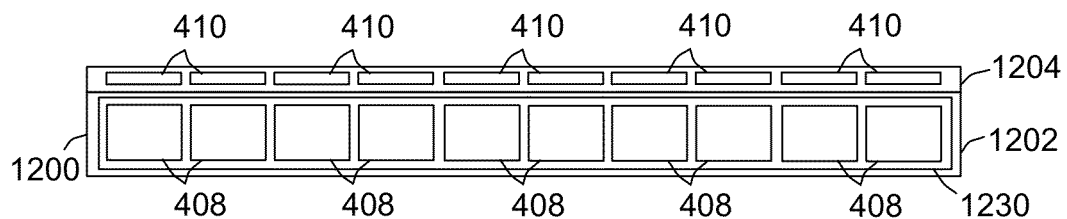

Referring to FIGS. 12A and 12B, respective top and side views of schematic block diagrams illustrate embodiments of a memory device that is operable to facilitate engineering acceptable redundancy for loss-tolerant data using control logic that is distributed in memory with multiple command logic blocks associated with multiple memory elements. Hence, the memory device 1200 can be formed such that the memory array 1202 includes at least one non-volatile memory array 1230 that is partitioned into a plurality of memory blocks 1232. The control logic 1204 can be partitioned into a plurality of command logic blocks 1440 spatially distributed over the non-volatile memory array 1230 wherein ones of the plurality of command logic blocks 1240 are associated with ones of the plurality of memory blocks 1232.

In some applications and/or embodiments, different memory blocks can be allocated for respective different functionality so that the command logic blocks can support functionality that is specific to the appropriate memory blocks.

Figure 13A:
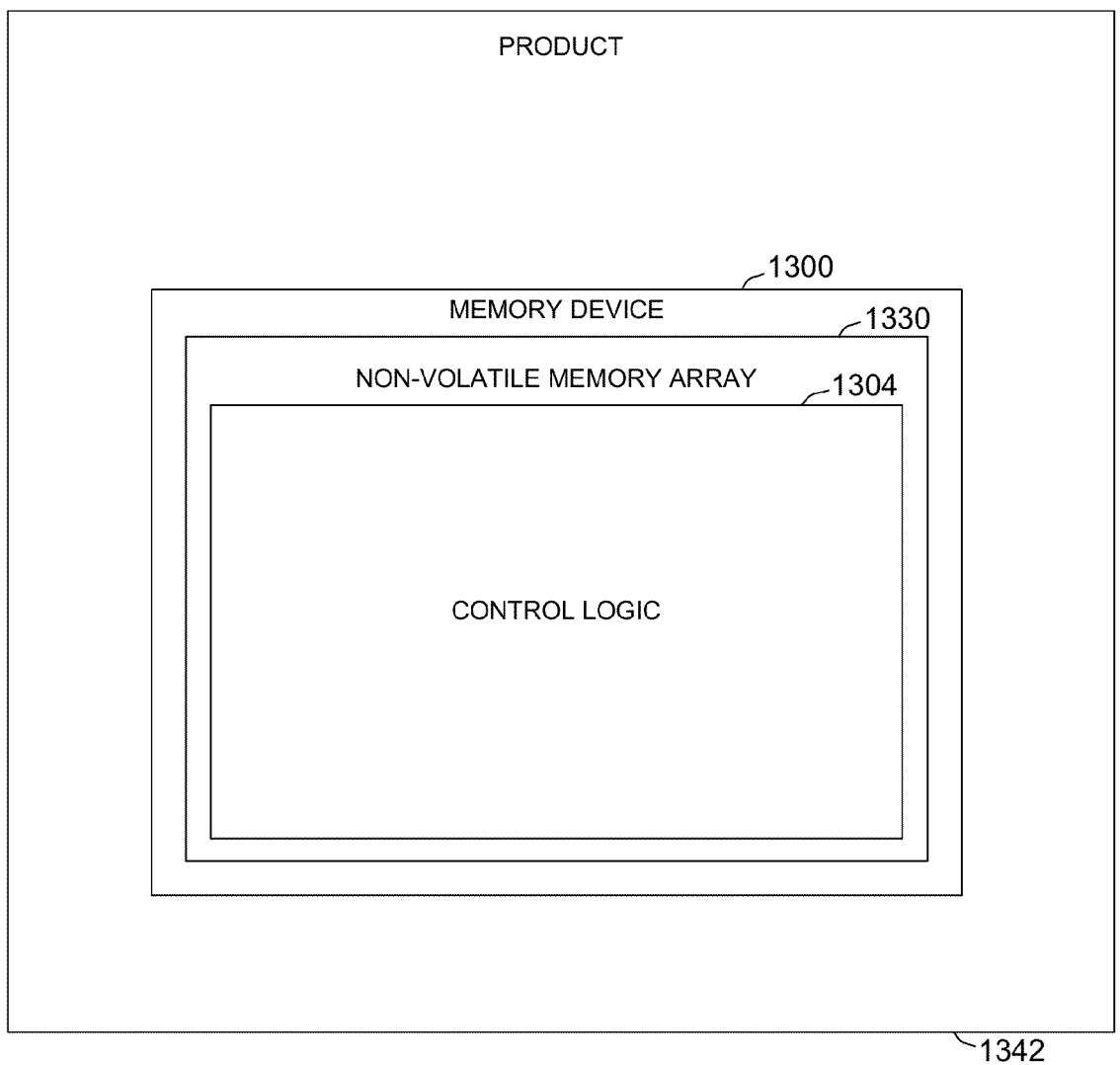
FIGS. 13A and 13B are respective top and side views of schematic block diagrams showing embodiments of a memory device that is operable to facilitate engineering acceptable redundancy for loss-tolerant data and is integrated into a product.
Figure 13B:
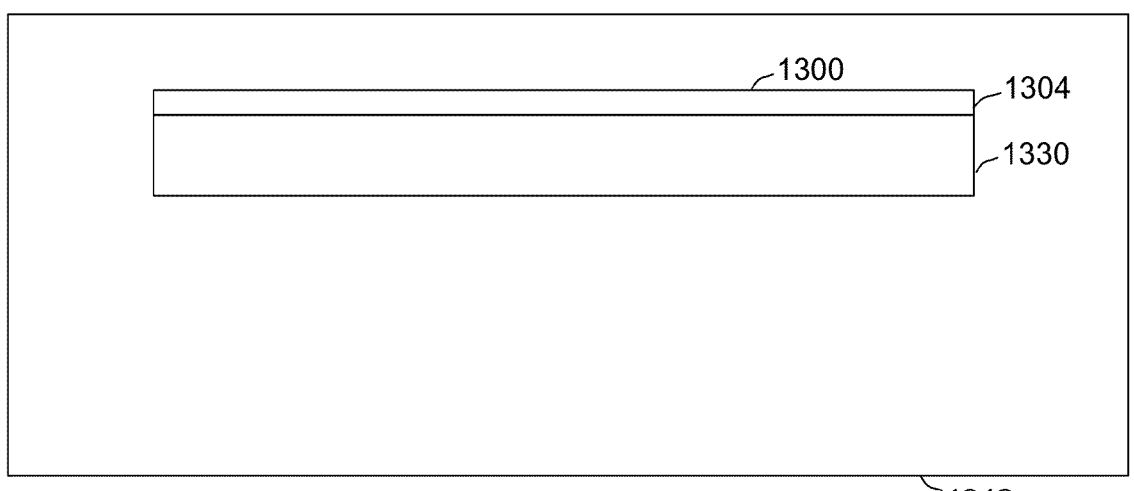

Referring to FIGS. 13A and 13B, respective top and side views of schematic block diagrams show embodiments of a memory device that is operable to facilitate engineering acceptable redundancy for loss-tolerant data and is integrated into a product. In some applications and/or embodiments, the memory device 1300 can include control logic 1304 that is operable to operate in combination with the non-volatile memory array 1330 to accumulate information about a product 1342. Custom versions of the memory device 1300, which includes processing functionality of the control logic 1304 combined with the non-volatile memory array 1330, can be integrated into any type of product 1342, for example electronic devices, such as mobile and cell phones, notebook computers, personal digital assistants, medical devices, medical diagnostic systems, digital cameras, audio players, digital televisions, automotive and transportation engine control units, USB flash personal discs, and global positioning systems.

In other applications and/or contexts, a memory system can be formed of printed non-volatile memory on polymer. In some arrangements, a printed non-volatile memory on polymer can form flexible memories. For example, a flexible memory can be integrated with processors for further integration into any type of product, even very simple products such as bottles, cans, or packaging materials. A non-volatile memory can be integrated in a system of any suitable product such as, for example, a door handle sleeve to detect and record who, what, when, and how anyone has touched the door handle. Such a system can be used to facilitate access or to provide security. In other examples, a non-volatile memory and processor in some applications with sensors and/or a communication interface can be used in a flexible device for a medical product such as bandages or implants. These products can be formed of dissolvable materials for temporary usage, for example in biocompatible electronic or medical devices that can dissolve in a body environment, or environmental monitors and consumer electronics that can dissolve in compost. Other applications of products incorporating non-volatile memory and processor can include sporting equipment, tags such as for rental cars, patient armbands in hospitals tied to sensors, smart glasses, or any type of device.

In further embodiments, instead of a flexible polymer, the non-volatile memory and processor can be formed of silicon that is sufficiently thin to become flexible and thus formed as an inexpensive printed circuit component. Flexible memory in ubiquitous items, using polymer memory or silicon memory, can enable various profitable services, for example in conjunction with medical devices, security services, automotive products, and the like.

In embodiments of the memory device with processing capability of control logic integrated in a distributed manner with non-volatile memory, the processing capability can be implemented with relatively low speed requirement to enable processors to be available in a ubiquitous manner. Accordingly, information can be acquired in a dispersed manner and intercommunicated over vast systems. Thus processors can be inexpensive and memory readily available for various consumer items. Custom versions of memory including non-volatile memory and RAM can be integrated into virtually any product, enabling widespread preprocessing in items such as door handles to determine who has accessed a location and how the access was made to allow any type of processing on the information.

Figure 14:
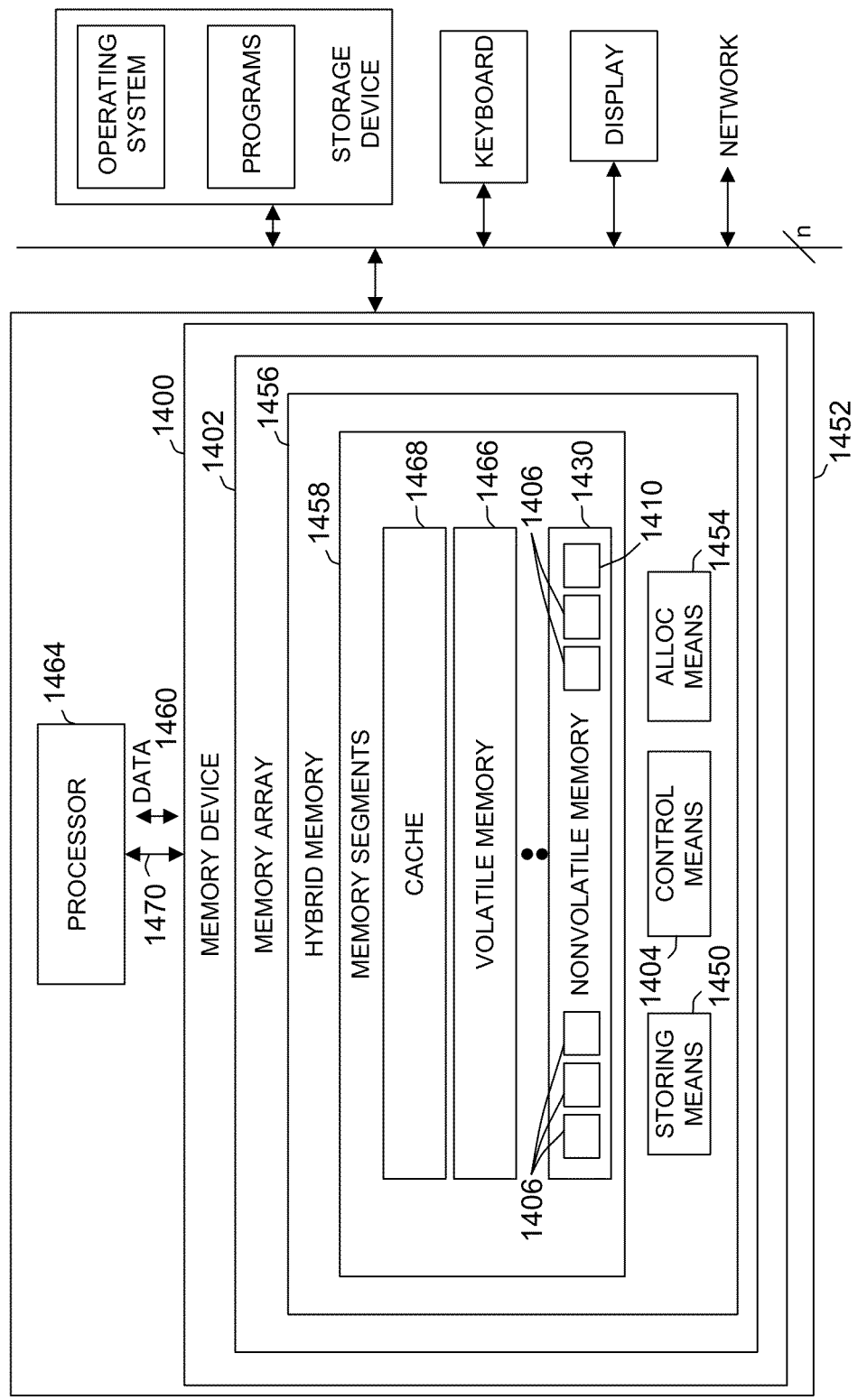
FIG. 14 is a schematic block diagram showing an embodiment of a memory device including means for storing information constituted to facilitate engineering acceptable redundancy for loss-tolerant data using control and/or computation logic integrated into memory.

Referring to FIG. 14, a schematic block diagram shows an embodiment of a memory device including means for storing information constituted to facilitate engineering acceptable redundancy for loss-tolerant data using control and/or computation logic integrated into memory. Accordingly, in further embodiments, as depicted in FIG. 14, a memory system 1452 includes means 1450 for storing information in a memory array 1402 including a plurality of memory sections 1406 characterized by a plurality of memory types, means 1404 integrated with and distributed over the memory array 1402 for controlling the means 1450 for storing information, and means 1454 for selectively allocating redundant sections 1410 in the plurality of memory sections 1406.

In an example embodiment, the memory device 1400 can include a hybrid memory 1456 that includes multiple memory segments 1458 characterized by a multiple different operating characteristics. The hybrid memory 1456 can store data 1460 communicated from a processor 1464. The memory device 1400 can further include logic 1462 for performing encryption operations on the data 1460 during transfers between the memory segments 1458.

In some embodiments, the memory device 1400 can be constituted wherein the logic 1462 operable to perform encryption operations is operable to perform encryption operations on the data 1460 during transfers between the processor 1464 and the multiple memory segments 1458.

The multiple memory segments 1458 can be arranged to include various types of memory with different characteristics and speeds, for example the multiple memory segments 1458 can comprise volatile main memory 1466, non-volatile main memory 1430, or a combination of memory types.

In particular embodiments, the multiple memory segments 1458 can constitute a volatile main memory 1466 and a non-volatile main memory 1430 wherein the volatile main memory 1466 has faster operating characteristics than the non-volatile main memory 1430. For example, the multiple memory segments 1458 can be formed in memory subsystem combining DRAM and a large amount of nonvolatile memory such as flash or phase change memory (PCM).

In some memory device 1400 embodiments, the multiple memory segments 1458 can include a cache 1468. In an example embodiment, DRAM can operate as a cache 1468 for the PCM or nonvolatile memory, facilitating channel encryption between the processor 1464 and the memory device 1400. The logic 1462 operable to perform encryption operations can decrypt the information encrypted by the processor 1464 and sent over the channel and store the decrypted information in the DRAM, then can use storage encryption when passing the information from the DRAM to the PCM or nonvolatile memory 1430.

Various embodiments of the memory device 1400 can be configured for channel encryption. For instance, the logic 1462 operable to perform encryption operations can function to encrypt data 1460 on a communication channel 1470 that communicates information between the processor 1464 and the hybrid memory 1456.

The memory device 1400 can be configured to perform one or more of several channel encryption operations in cooperation with a processor 1464. For instance, the logic 1462 operable to perform encryption operations can operable to decrypt information encrypted by the processor 1464. In some embodiments and/or conditions, the logic 1462 operable to perform encryption operations is operable to decrypt address and data information encrypted by the processor 1464 and store data at the address in the hybrid memory 1456. Similarly, the memory device 1400 can be configured wherein the logic 1462 operable to perform encryption operations is operable to partially decrypt information encrypted by the processor 1464.

Some embodiments of the memory device 1400 can include a random number generator, for example which can be closely associated to and integrated onto the memory device 1400 chip. Accordingly, the control logic 1404 can implement a pseudo-random number generator coupled to the hybrid memory 1456 and coupled to the logic 1462 operable to perform encryption operations. The pseudo-random number generator can be operable to generate numbers for usage in encrypting information.

The memory device 1400 can be configured to implement one or more of a variety of security schemes including channel encryption, storage encryption, RSA (Rivest, Shamir, Adleman) cryptography and key distribution, Public Key Infrastructure (PKI). Accordingly, the logic 1462 operable to perform encryption operations can be operable to perform stream encryption of communicated information wherein processor and memory sides are assigned a key. In another example functionality, the logic 1462 operable to perform encryption operations can be operable to encrypt information that is storage encrypted wherein the storage-encrypted information is encrypted by the processor 1464, stored in the hybrid memory 1456, accessed from the hybrid memory 1456, and decrypted by the processor 1464.

In a particular applications and/or arrangements, the security perimeter can be formed within the memory device 1400 and, for example, enclose the entire memory device 1400, between dynamic random access memory (DRAM) and the memory device 1400, between non-volatile random access memory (RAM) and the memory device 1400, or any other suitable position. The cryptographic and/or tamper-handling perimeter can further be generalized for positioning between a smaller amount of memory and a larger amount of memory in the memory device 1400. Some embodiments can include a cryptographic perimeter in the absence of a tamper-handling perimeter.

In some embodiments, the logic 1462 operable to perform encryption operations can be operable to perform time-varying encryption. For example, channel encryption assisted by the memory device 1400 can enable randomization of encrypted information wherein encrypted data is read back and encryption can be stripped off by the receiving processor 1464. The memory device 1400 with logic or other smart component can enable time-varying encryption. Data can be written to an address which, when read back, is different, but no information is lost since the reading processor 1464 or other reading device at the opposite side of the channel from the smart memory has sufficient intelligence capability to strip off the encryption.

Figure 15A:
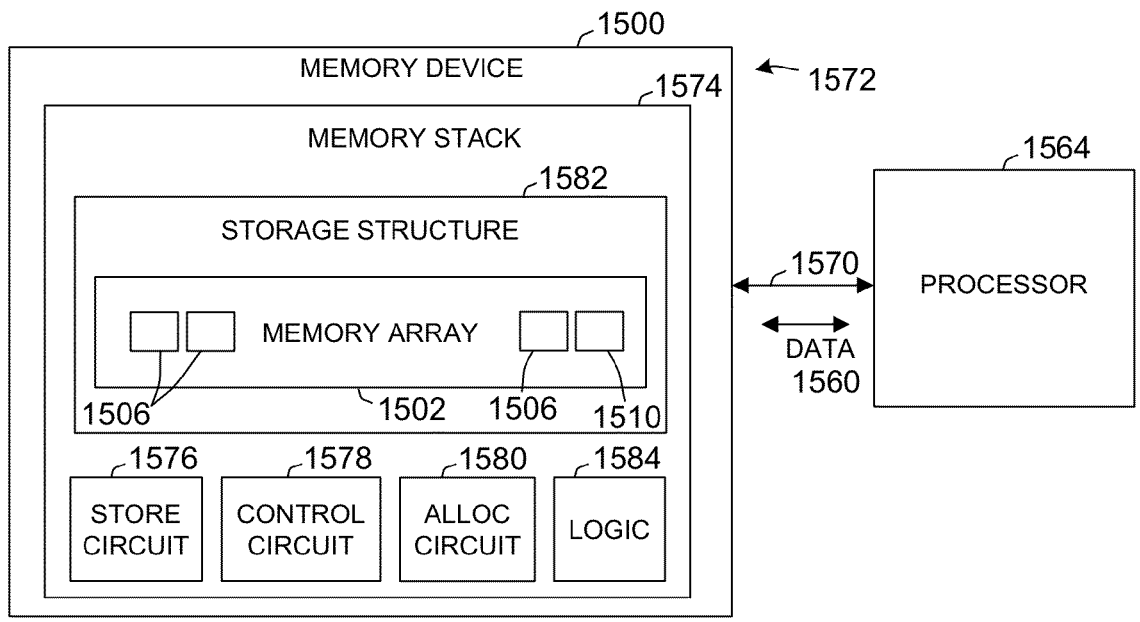
FIGS. 15A and 15B are a schematic block diagram and a side pictorial view illustrating an embodiment of circuitry for storing information to facilitate engineering acceptable redundancy for loss-tolerant data including control and/or computation logic integrated into memory.
Figure 15B:
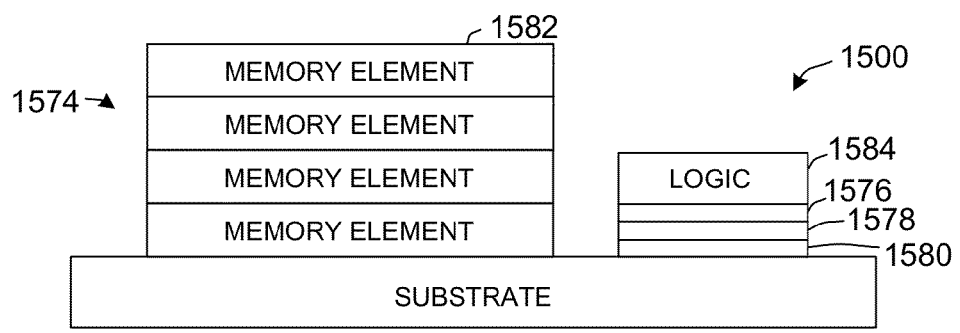

Referring to FIGS. 15A and 15B, a schematic block diagram and a side pictorial view illustrate an embodiment of circuitry for storing information to facilitate engineering acceptable redundancy for loss-tolerant data including control and/or computation logic integrated into memory. In other embodiments and/or applications, a system 1570 can be formed of circuitry. An embodiment of the system 1570 can include circuitry 1576 for storing information in a memory array 1502 including a plurality of memory sections 1506 characterized by a plurality of memory types, circuitry 1578 integrated with and distributed over the memory array 1502 for controlling the means for storing information, and circuitry 1580 for selectively allocating redundant sections 1510 in the plurality of memory sections 1506.

Embodiments of a memory device 1500 that makes use of a memory stack 1574 to facilitate intelligent memory computation. In a particular example embodiment, intelligent memory computation can include security capabilities, including cryptographic security. In an illustrative embodiment, the memory device 1500 can comprise a memory stack 1574 operable to store data 1560 communicated from a processor 1564. The memory stack 1574 can comprise a storage structure 1582 and logic 1584 operable to perform encryption operations. The storage structure 1582 is operable to store data 1560 communicated via a communication channel 1570 from the processor 1564. The logic 1584 is operable to perform encryption operations on the data 1560 during transfers between the processor 1564 and the storage structure 1582.

The memory device 1500 can be constituted to facilitate channel encryption through operation of the logic 1584 operable to perform encryption operations. Accordingly, the logic 1584 operable to perform encryption operations can be operable to perform channel encryption operations on a communication channel 1570 that communicates information between the processor 1564 and the memory stack 1574. Channel encryption can improve performance and economy in various applications and conditions in comparison to expensive storage encryption. The logic 1584 operable to perform encryption operations can facilitate good memory encryption, for example between the processor 1564 and the memory stack 1574. An illustrative configuration can include a CPU that interacts with the memory stack 1574 comprising multiple DRAM chips and the logic 1584 operable to perform encryption operations integrated into a logic chip operable to perform strong channel encryption between the CPU and the memory stack 1574.

In various embodiments, the memory device 1500, the memory stack 1574, and the logic 1584 operable to perform encryption operations can be constituted to perform one or more of several security operations. For example, the logic 1584 operable to perform encryption operations is operable to decrypt information encrypted by the processor 1564. Similarly, the logic 1584 operable to perform encryption operations is operable to partially decrypt information encrypted by the processor 1564. The logic 1584 can also be operable to perform encryption operations is operable to perform stream encryption of information communicated on a communication channel 1570 wherein processor and memory sides of the communication channel 1570 are assigned a key. In an embodiment or circumstances where security can be best attained by using a combination of storage encryption and channel encryption, the logic 1584 operable to perform encryption operations is operable to perform channel encryption operations on a communication channel 1570 for information that is storage encrypted wherein the storage-encrypted information is encrypted by the processor 1564, stored in the memory stack 1574, accessed from the memory stack 1574, and decrypted by the processor 1564. The logic 1584 operable to perform encryption operations can also be operable to perform time-varying encryption.

Information can be stored in the memory stack 1574 unencrypted or the logic 1584 can encrypt the data for storage. Thus, channel encryption can be performed between the CPU and a logic chip, enabling cryptographic security without requiring storage encryption of data stored in the logic chip.

Referring to FIGS. 16A through 16S and FIGS. 17A through 17K, multiple schematic flow charts show several embodiments and/or aspects of a method of operating a memory device for storing information to facilitate engineering acceptable redundancy for loss-tolerant data using control and/or computation logic integrated into memory. The illustrative method 1600, depicted in FIG. 16A, of operating a memory device includes providing 1601 a memory array including a plurality of memory sections characterized by a plurality of memory types and providing 1602 a control logic integrated with and distributed over the memory array. The method can further include operating 1603 the control logic to selectively allocate redundant sections in the plurality of memory sections.

Referring to FIG. 16B, in some embodiments, a method 1604 of operating the memory device can further include providing 1605 in the memory array the plurality of memory sections including a plurality of different operating characteristics, and operating 1606 the control logic including allocating 1607 the redundant sections to memory sections with different operating characteristics.

In further embodiments and/or applications, as shown in FIG. 16C, the method 1608 of operating the memory device can further include providing 1609 in the memory array the plurality of memory sections including a plurality of different failure conditions, and operating 1610 the control logic. Operating 1610 the control logic can include allocating 1611 the redundant sections to memory sections with different failure conditions.

In various embodiments, as depicted in FIG. 16D, the method 1612 of operating the memory device can further include providing 1613 in the memory array the plurality of memory sections including at least one memory section susceptible to failure due to a temperature condition and at least one memory section resistant to the failure due to the temperature condition, and operating 1614 the control logic. Operating 1614 the control logic can further include allocating 1615 at least one memory section resistant to the failure due to the temperature condition redundant to the at least one memory section susceptible to failure due to a temperature condition.

Referring to FIG. 16E, in some embodiments, the method 1616 of operating the memory device can further include providing 1617 in the memory array the plurality of memory sections including at least one memory section susceptible to failure due to a magnetic field condition and at least one memory section resistant to the failure due to the magnetic field condition, and operating 1618 the control logic. Operating 1618 the control logic can include allocating 1619 at least one memory section resistant to the failure due to the magnetic field condition redundant to the at least one memory section susceptible to failure due to a magnetic field condition.

As shown in FIG. 16F, in various embodiments and/or applications, the method 1620 of operating the memory device can further include providing 1621 in the memory array at least one memory section including fast memory and at least one memory section including slow memory that has slower access speed than the at least one memory section including fast memory, and operating 1622 the control logic. Operating the control logic 1622 can include selectively allocating 1623 portions of the memory section including fast memory and the memory section including slow memory that are mutually redundant.

In some embodiments, illustrated in FIG. 16G, the method 1624 of operating the memory device can further include providing 1625 in the memory array a first memory section and a second memory section that is redundant to the first memory section, and operating 1626 the control logic. Operating 1626 the control logic can include representing 1627 data in the second memory section as a hash of data in the first memory section.

In various embodiments and/or applications, as shown in FIG. 16H, the method 1628 of operating the memory device can further include providing 1629 in the memory array a first memory section and a second memory section that is redundant to the first memory section, and operating 1630 the control logic. Operating the control logic 1630 can include dumping 1631 data in the first memory section to the second memory section at selected times.

Referring to FIG. 16I, selected embodiments of the method 1632 of operating the memory device can further include providing 1633 in the memory array at least one redundant non-volatile memory array, and operating 1634 the control logic. Operating 1634 the control logic can include dumping 1635 data to the at least one redundant non-volatile memory array at selected times.

As illustrated in FIG. 16J, some embodiments of the method 1636 of operating the memory device can further include providing 1637 in the memory array at least one non-volatile memory array including a plurality of memory blocks characterized by a plurality of different operating characteristics, and operating 1638 the control logic. Operating 1638 the control logic can include selectively managing 1639 redundant sections in the plurality of memory blocks based on at least one of the a plurality of different operating characteristics.

As shown in FIG. 16K, an embodiment of the method 1640 of operating the memory device can further include providing 1641 in the memory array at least one non-volatile memory array including a plurality of memory blocks characterized by a plurality of different operating characteristics, and operating 1642 the control logic. Operating 1642 the control logic can include analyzing 1643 memory accesses, and selectively managing 1644 redundant sections in the plurality of memory blocks based on the analysis.

Referring to FIG. 16L, in some embodiments, the method 1645 of operating the memory device can further include providing 1646 in the memory array at least one non-volatile memory array including a plurality of memory blocks characterized by a plurality of different operating characteristics, and operating 1647 the control logic. Operating 1647 the control logic can include analyzing 1648 memory accesses, determining 1649 application constraints based on the analysis, and selectively managing 1650 redundant sections in the plurality of memory blocks based on the determined application constraints.

Figures 16M, 16N:
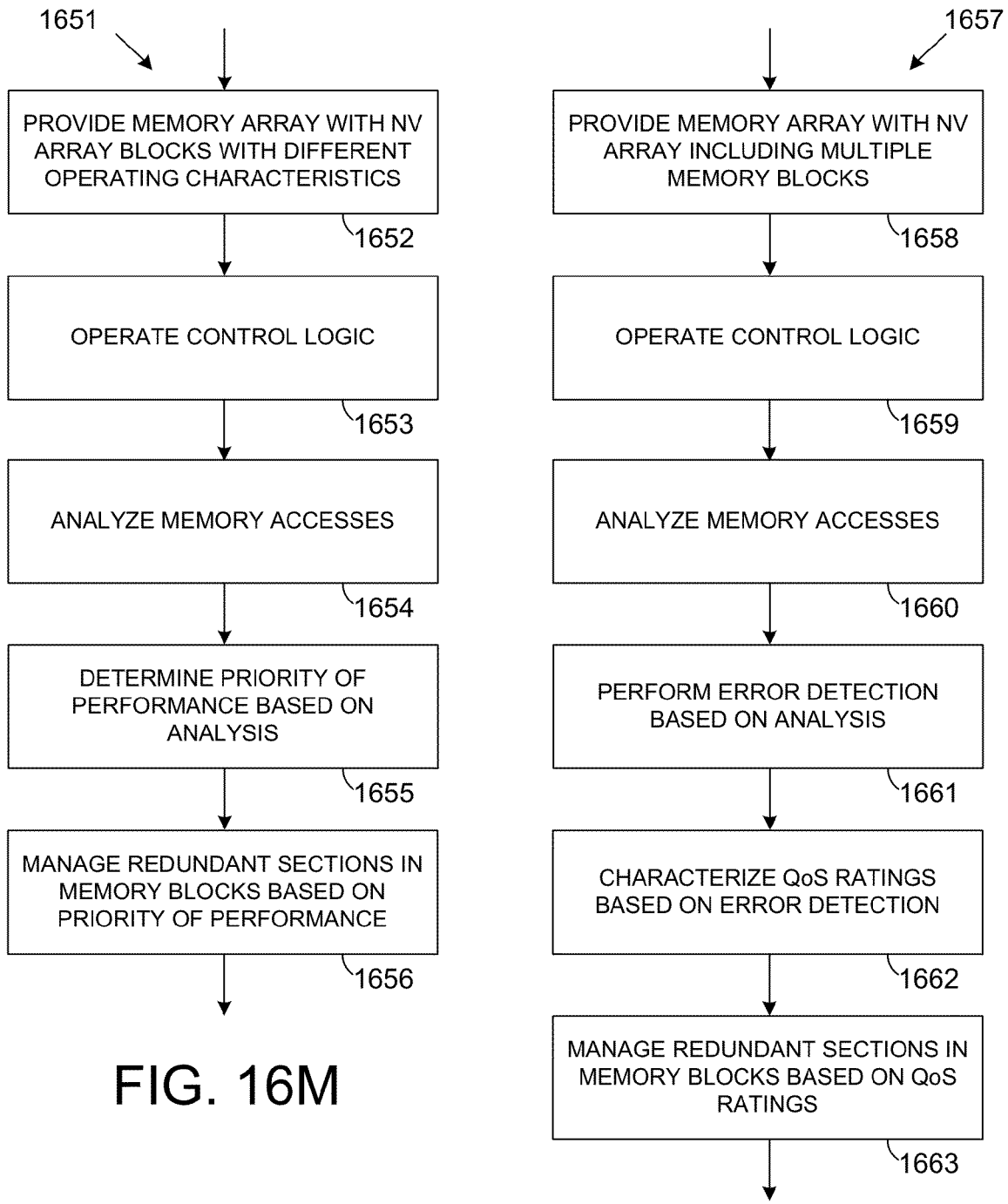

In further embodiments and/or applications, as shown in FIG. 16M, the method 1651 of operating the memory device can further include providing 1652 in the memory array at least one non-volatile memory array including a plurality of memory blocks characterized by a plurality of different operating characteristics, and operating 1653 the control logic. Operating 1653 the control logic can include analyze 1654 memory accesses, determining 1655 priority of performance based on the analysis, and selectively managing 1656 redundant sections in the plurality of memory blocks based on the determined priority of performance.

In various embodiments, as depicted in FIG. 16N, the method 1657 of operating the memory device can further include providing 1658 in the memory array at least one non-volatile memory array including a plurality of memory blocks, and operating 1659 the control logic. Operating 1659 the control logic can include analyzing 1660 memory accesses, performing 1661 error detection based on the analysis, characterizing 1662 Quality-of-Service (QoS) ratings of the plurality of memory blocks based on the performed error detection, and selectively 1663 managing redundant sections in the plurality of memory blocks based on the characterized QoS ratings.

Referring to FIG. 16O, in some embodiments, the method 1664 of operating the memory device can further include providing 1665 in the memory array at least one non-volatile memory array including a plurality of memory blocks, and operating 1666 the control logic. Operating 1666 the control logic can include receiving 1667 a report on operating conditions of system performance at system bootstrap loading, and selectively managing 1668 redundant sections in the plurality of memory blocks based on the report.

As shown in FIG. 16P, in various embodiments and/or applications, the method 1669 of operating the memory device can further include providing 1670 in the memory array at least one non-volatile memory array including a plurality of memory blocks, and operating 1671 the control logic. Operating 1671 the control logic can include monitoring 1672 writes to the plurality of memory blocks of the non-volatile memory array, and selectively managing 1673 redundant sections in the plurality of memory blocks based on results of the monitoring.

In some embodiments, illustrated in FIG. 16Q, the method 1674 of operating the memory device can further include providing 1675 in the memory array at least one non-volatile memory array including a plurality of memory blocks, and operating 1676 the control logic. Operating 1676 the control logic can include monitoring 1677 operating characteristics of the memory device, analyzing 1678 the monitored operating characteristics, detecting 1679 a precursor to a memory failure based on the analysis, and selectively 1680 managing redundant sections in the plurality of memory blocks based on the detected precursor.

In various embodiments and/or applications, as shown in FIG. 16R, the method 1681 of operating the memory device can further include providing 1682 at least one sensor operable to detect an operating condition, providing 1683 in the memory array at least one non-volatile memory array including a plurality of memory blocks, and operating 1684 the control logic. Operating 1684 the control logic can include monitoring 1685 the operating condition, analyzing 1686 the monitored operating condition, detecting 1687 a precursor to a memory failure based on the analysis, and selectively managing 1688 redundant sections in the plurality of memory blocks based on the detected precursor.

Figures 16S, 17A:
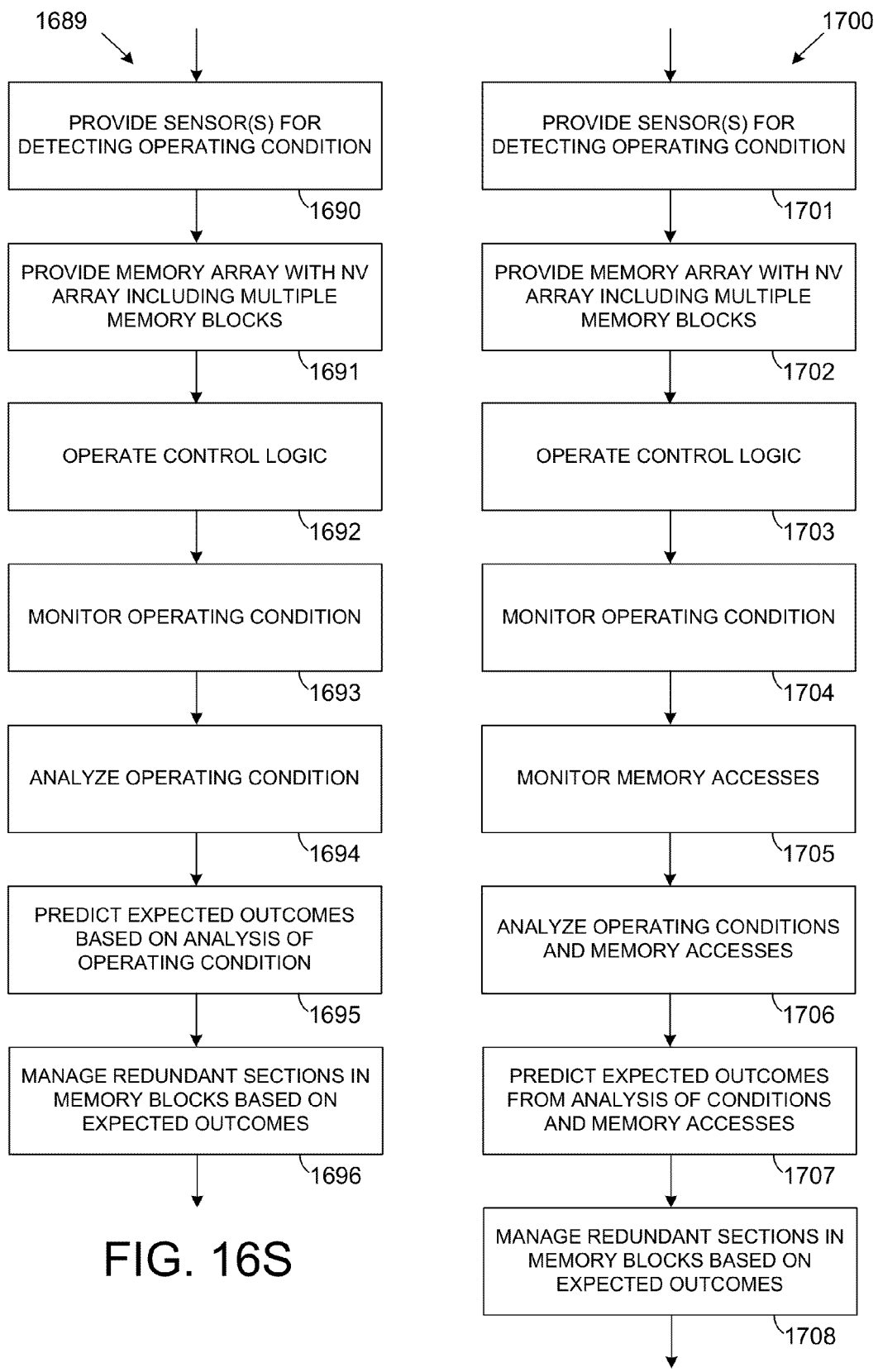

Referring to FIG. 16S, selected embodiments of the method 1689 of operating the memory device can further include providing 1690 at least one sensor operable to detect an operating condition, providing 1691 in the memory array at least one non-volatile memory array including a plurality of memory blocks, and operating 1692 the control logic. Operating 1692 the control logic can include monitoring 1693 the operating condition, analyzing 1694 the monitored operating conditions, predicting 1695 expected outcomes based on the analysis of the monitored operating conditions, and selectively managing 1696 redundant sections in the plurality of memory blocks based on the predicted expected outcomes.

As illustrated in FIG. 17A, some embodiments of the method 1700 of operating the memory device can further include providing 1701 at least one sensor operable to detect an operating condition, providing 1702 in the memory array at least one non-volatile memory array including a plurality of memory blocks, and operating 1703 the control logic. Operating 1703 the control logic can include monitoring 1704 the operating condition, monitoring 1705 memory accesses, analyzing 1706 the monitored operating conditions and memory accesses, predicting 1707 expected outcomes based on the analysis of the monitored operating conditions and memory accesses, and selectively managing 1708 redundant sections in the plurality of memory blocks based on the predicted expected outcomes.

Figures 17B, 17C:
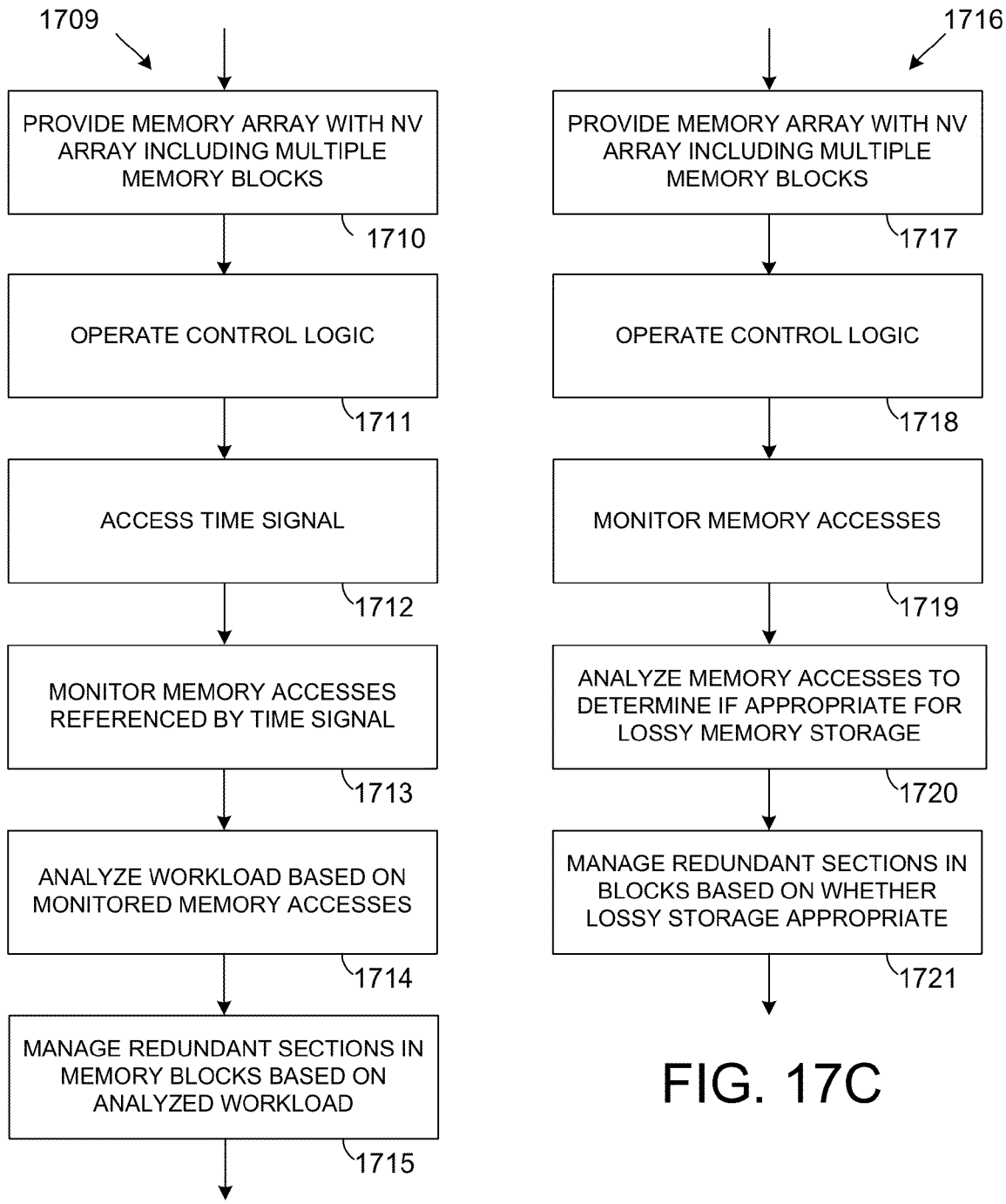

As shown in FIG. 17B, an embodiment of the method 1709 of operating the memory device can further include providing 1710 in the memory array at least one non-volatile memory array including a plurality of memory blocks, and operating 1711 the control logic. Operating 1711 the control logic can include accessing 1712 a time signal, monitoring 713 memory accesses referenced by the time signal, analyzing 1714 workload based on the monitored memory accesses, and selectively managing 1715 redundant sections in the plurality of memory blocks based on the analyzed workload.

Referring to FIG. 17C, in some embodiments, the method 1716 of operating the memory device can further include providing 1717 in the memory array at least one non-volatile memory array including a plurality of memory blocks including at least one memory block including lossy memory, and operating 1718 the control logic. Operating 1718 the control logic can include monitoring 1719 memory accesses, analyzing 1720 the memory accesses to determine instructions and data indicative for storage in the at least one memory block including lossy memory, and selectively managing 1721 redundant sections in the plurality of memory blocks including lossy memory.

Figure 17F:
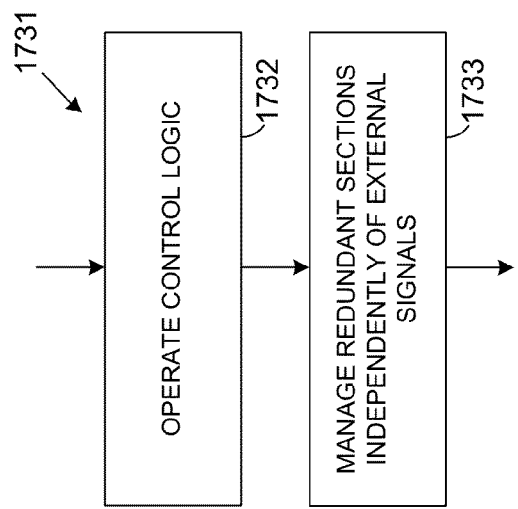
Figure 17E:
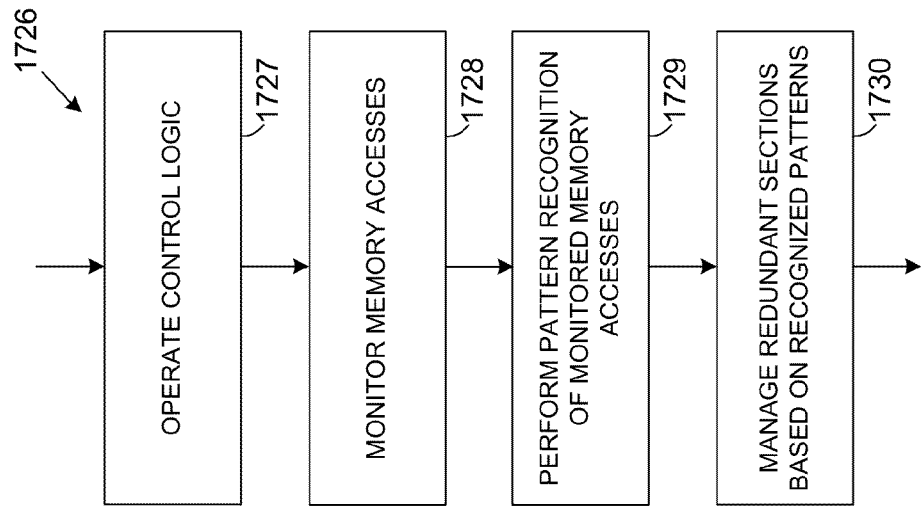
Figure 17D:
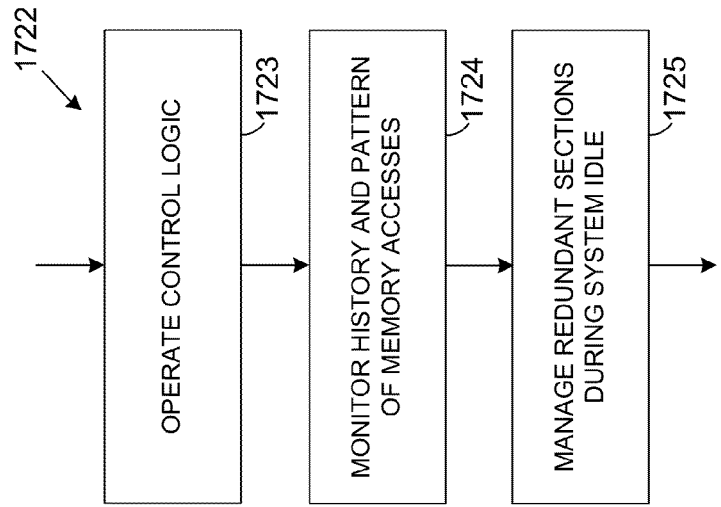

In further embodiments and/or applications, as shown in FIG. 17D, the method 1722 of operating the memory device can further include operating 1723 the control logic. Operating 1723 the control logic can include monitoring 1724 a history and pattern of memory accesses, and selectively managing 1725 redundant sections in the plurality of memory sections during system idle.

In various embodiments, as depicted in FIG. 17E, the method 1726 of operating the memory device can further include operating 1727 the control logic. Operating 1727 the control logic can include monitoring 1728 memory accesses, performing 1729 pattern recognition of the monitored memory accesses, and selectively managing 1730 redundant sections in the plurality of memory sections based on recognized patterns.

Referring to FIG. 17F, in some embodiments, the method 1731 of operating the memory device can further include operating 1732 the control logic. Operating 1732 the control logic can include managing 1733 redundant sections in the plurality of memory sections independently of signals external to the memory device.

As shown in FIG. 17G, in various embodiments and/or applications, the method 1734 of operating the memory device can further include operating 1735 the control logic. Operating 1735 the control logic can include monitoring 1736 operating characteristics of the memory device, analyzing 1737 the monitored operating characteristics, detecting 1738 a precursor to a memory failure based on the analysis, and managing 1739 redundant sections in the plurality of memory sections based on the detected precursor.

In some embodiments, illustrated in FIG. 17H, the method 1740 of operating the memory device can further include providing 1741 in the memory array at least one non-volatile memory array including a plurality of memory elements, and operating 1742 the control logic. Operating 1742 the control logic can include monitoring 1743 writes to the plurality of memory elements of the non-volatile memory array, and allocating 1744 as redundant sections one or more of the plurality of memory sections characterized by write endurance.

In various embodiments and/or applications, as shown in FIG. 17I, the method 1745 of operating the memory device can further include providing 1746 in the memory array at least one non-volatile memory array including a plurality of memory elements, and operating 1747 the control logic. Operating 1747 the control logic can include monitoring 1748 writes to the plurality of memory elements of the non-volatile memory array, and allocating 1749 as redundant sections one or more of the plurality of memory sections that have a history of fewer writes.

As illustrated in FIG. 17J, some embodiments of the method 1750 of operating the memory device can further include providing 1751 in the memory array at least one non-volatile memory array that is partitioned into a plurality of memory blocks, and partitioning 1752 the control logic into a plurality of command logic blocks spatially distributed over the non-volatile memory array wherein ones of the plurality of command logic blocks are associated with ones of the plurality of memory blocks.

As shown in FIG. 17K, an embodiment of the method 1753 of operating the memory device can further include operating 1754 the control logic including operating 1755 in combination with the non-volatile memory array to accumulate information about a product.

Those having ordinary skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those having ordinary skill in the art will recognize that optical aspects of implementations will typically employ optically-oriented hardware, software, and or firmware.

In some implementations described herein, logic and similar implementations may include software or other control structures suitable to operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described above. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those having ordinary skill in the art will recognize how to obtain, configure, and optimize suitable transmission or computational elements, material supplies, actuators, or other common structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those having ordinary skill in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those having ordinary skill in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those having ordinary skill in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electromagnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those having ordinary skill in the art will also appreciate that examples of electro-mechanical systems include but are not limited to a variety of consumer electronics systems, medical devices, as well as other systems such as motorized transport systems, factory automation systems, security systems, and/or communication/computing systems. Those having ordinary skill in the art will recognize that electro-mechanical as used herein is not necessarily limited to a system that has both electrical and mechanical actuation except as context may dictate otherwise.

In a general sense, those having ordinary skill in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those having ordinary skill in the art will recognize that at least a portion of the devices and/or processes described herein can be integrated into an image processing system. Those having skill in the art will recognize that a typical image processing system generally includes one or more of a system unit housing, a video display device, memory such as volatile or non-volatile memory, processors such as microprocessors or digital signal processors, computational entities such as operating systems, drivers, applications programs, one or more interaction devices (e.g., a touch pad, a touch screen, an antenna, etc.), control systems including feedback loops and control motors (e.g., feedback for sensing lens position and/or velocity; control motors for moving/distorting lenses to give desired focuses). An image processing system may be implemented utilizing suitable commercially available components, such as those typically found in digital still systems and/or digital motion systems.

Those having ordinary skill in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems. Those having ordinary skill in the art will recognize that at least a portion of the devices and/or processes described herein can be integrated into a mote system. Those having skill in the art will recognize that a typical mote system generally includes one or more memories such as volatile or non-volatile memories, processors such as microprocessors or digital signal processors, computational entities such as operating systems, user interfaces, drivers, sensors, actuators, applications programs, one or more interaction devices (e.g., an antenna USB ports, acoustic ports, etc.), control systems including feedback loops and control motors (e.g., feedback for sensing or estimating position and/or velocity; control motors for moving and/or adjusting components and/or quantities). A mote system may be implemented utilizing suitable components, such as those found in mote computing/communication systems. Specific examples of such components entail such as Intel Corporation's and/or Crossbow Corporation's mote components and supporting hardware, software, and/or firmware.

Those having ordinary skill in the art will recognize that it is common within the art to implement devices and/or processes and/or systems, and thereafter use engineering and/or other practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems of (a) an air conveyance (e.g., an airplane, rocket, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Qwest, Southwestern Bell, etc.), or (g) a wired/wireless services entity (e.g., Sprint, Cingular, Nextel, etc.), etc.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory). A sale of a system or method may likewise occur in a territory even if components of the system or method are located and/or used outside the territory. Further, implementation of at least part of a system for performing a method in one territory does not preclude use of the system in another territory.

One of ordinary skill in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Those having ordinary skill in the art will appreciate that a user may be representative of a human user, a robotic user (e.g., computational entity), and/or substantially any combination thereof (e.g., a user may be assisted by one or more robotic agents) unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those having ordinary skill in the art will recognize that "configured to" can generally encompass active-state components and/or inactive-state components and/or standby-state components, unless context requires otherwise. While particular aspects of the present subject matter described herein have been shown and described, it will be apparent to those having ordinary skill in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those having ordinary skill in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms. For example, the phrase "A or B" will be typically understood to include the possibilities of "A" or "B" or "A and B."

With respect to the appended claims, those having ordinary skill in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A memory device comprising:
a memory array comprising a plurality of memory sections characterized by a plurality of memory types; and
control logic integrated with and distributed over the memory array, the control logic operable to selectively allocate redundant sections in the plurality of memory sections.

2. The memory device according to claim 1 wherein:
the memory array includes the plurality of memory sections including a plurality of different operating characteristics; and
the control logic is operable to allocate the redundant sections to memory sections with different operating characteristics.

3. The memory device according to claim 1 wherein:
the memory array includes the plurality of memory sections including a plurality of different failure conditions; and
the control logic is operable to allocate the redundant sections to memory sections with different failure conditions.

4. The memory device according to claim 1 wherein:
the memory array includes the plurality of memory sections including at least one memory section susceptible to failure due to a temperature condition and at least one memory section resistant to the failure due to the temperature condition; and
the control logic is operable to allocate the at least one memory section resistant to the failure due to the temperature condition redundant to the at least one memory section susceptible to failure due to a temperature condition.

5. The memory device according to claim 1 wherein:
the memory array includes the plurality of memory sections including at least one memory section susceptible to failure due to a magnetic field condition and at least one memory section resistant to the failure due to the magnetic field condition; and
the control logic is operable to allocate the at least one memory section resistant to the failure due to the magnetic field condition redundant to the at least one memory section susceptible to failure due to a magnetic field condition.

6. The memory device according to claim 1 wherein:
a memory array including at least one memory section including fast memory and at least one memory section including slow memory that has slower access speed than the at least one memory section including fast memory; and
the control logic is operable to selectively allocate portions of the memory section including fast memory and the memory section including slow memory that are mutually redundant.

7. The memory device according to claim 1 wherein:
the memory array includes a first memory section and a second memory section that is redundant to the first memory section; and
the control logic is operable to represent data in the second memory section as a hash of data in the first memory section.

8. The memory device according to claim 1 wherein:
the memory array includes a first memory section and a second memory section that is redundant to the first memory section; and
the control logic is operable to dump data in the first memory section to the second memory section at selected times.

9. The memory device according to claim 1 wherein:
the memory array includes at least one redundant non-volatile memory array; and
the control logic is operable to dump data to the at least one redundant non-volatile memory array at selected times.

10. The memory device according to claim 1 wherein:
the memory array includes at least one non-volatile memory array including a plurality of memory blocks characterized by a plurality of different operating characteristics; and
the control logic is operable to selectively manage redundant sections in the plurality of memory blocks based on at least one of the a plurality of different operating characteristics.

11. The memory device according to claim 1 wherein:
the memory array includes at least one non-volatile memory array including a plurality of memory blocks characterized by a plurality of different operating characteristics; and
the control logic is operable to analyze memory accesses and selectively manage redundant sections in the plurality of memory blocks based on the analysis.

12. The memory device according to claim 1 wherein:
the memory array includes at least one non-volatile memory array including a plurality of memory blocks characterized by a plurality of different operating characteristics; and
the control logic is operable to analyze memory accesses, determine application constraints based on the analysis, and selectively manage redundant sections in the plurality of memory blocks based on the determined application constraints.

13. The memory device according to claim 1 wherein:
the memory array includes at least one non-volatile memory array including a plurality of memory blocks characterized by a plurality of different operating characteristics; and
the control logic is operable to analyze memory accesses, determine priority of performance based on the analysis, and selectively manage redundant sections in the plurality of memory blocks based on the determined priority of performance.

14. The memory device according to claim 1 wherein:
the memory array includes at least one non-volatile memory array including a plurality of memory blocks; and
the control logic is operable to analyze memory accesses, perform error detection based on the analysis, characterize Quality-of-Service (QoS) ratings of the plurality of memory blocks based on the performed error detection, and selectively manage redundant sections in the plurality of memory blocks based on the characterized QoS ratings.

15. The memory device according to claim 1 wherein:
the memory array includes at least one non-volatile memory array including a plurality of memory blocks; and
the control logic is operable to receive a report on operating conditions of system performance at system bootstrap loading, and selectively manage redundant sections in the plurality of memory blocks based on the report.

16. The memory device according to claim 1 wherein:
the memory array includes at least one non-volatile memory array including a plurality of memory blocks; and
the control logic is operable to monitor writes to the plurality of memory blocks of the non-volatile memory array, and selectively manage redundant sections in the plurality of memory blocks based on results of the monitoring.

17. The memory device according to claim 1 wherein:
the memory array includes at least one non-volatile memory array including a plurality of memory blocks; and
the control logic is operable to monitor operating characteristics of the memory device, analyze the monitored operating characteristics, detect a precursor to a memory failure based on the analysis, and selectively manage redundant sections in the plurality of memory blocks based on the detected precursor.

18. The memory device according to claim 1 further comprising:
at least one sensor operable to detect an operating condition, wherein:
the memory array includes at least one non-volatile memory array including a plurality of memory blocks; and
the control logic is operable to monitor the operating condition, analyze the monitored operating condition, detect a precursor to a memory failure based on the analysis, and selectively manage redundant sections in the plurality of memory blocks based on the detected precursor.

19. The memory device according to claim 1 further comprising:
at least one sensor operable to detect an operating condition, wherein:
the memory array includes at least one non-volatile memory array including a plurality of memory blocks; and
the control logic is operable to monitor the operating condition, analyze the monitored operating conditions, predict expected outcomes based on the analysis of the monitored operating conditions, and selectively manage redundant sections in the plurality of memory blocks based on the predicted expected outcomes.

20. The memory device according to claim 1 further comprising:
at least one sensor operable to detect an operating condition, wherein:
the memory array includes at least one non-volatile memory array including a plurality of memory blocks; and
the control logic is operable to monitor the operating condition, monitor memory accesses, analyze the monitored operating conditions and memory accesses, predict expected outcomes based on the analysis of the monitored operating conditions and memory accesses, and selectively manage redundant sections in the plurality of memory blocks based on the predicted expected outcomes.

21. The memory device according to claim 1 further comprising:
the memory array includes at least one non-volatile memory array including a plurality of memory blocks; and
the control logic is operable to access a time signal, monitor memory accesses referenced by the time signal, analyze workload based on the monitored memory accesses, and selectively manage redundant sections in the plurality of memory blocks based on the analyzed workload.

22. The memory device according to claim 1 further comprising:
the memory array includes at least one non-volatile memory array including a plurality of memory blocks including at least one memory block including lossy memory; and
the control logic is operable to monitor memory accesses, analyze the memory accesses to determine instructions and data indicative for storage in the at least one memory block including lossy memory, and selectively manage redundant sections in the plurality of memory blocks including lossy memory.

23. The memory device according to claim 1 wherein:
the control logic is operable to monitor a history and pattern of memory accesses and selectively manage redundant sections in the plurality of memory sections during system idle.

24. The memory device according to claim 1 wherein:
the control logic is operable to monitor memory accesses, perform pattern recognition of the monitored memory accesses, and selectively manage redundant sections in the plurality of memory sections based on recognized patterns.

25. The memory device according to claim 1 wherein:
the control logic is operable to manage redundant sections in the plurality of memory sections independently of signals external to the memory device.

26. The memory device according to claim 1 wherein:
the control logic is operable to monitor operating characteristics of the memory device, analyze the monitored operating characteristics, detect a precursor to a memory failure based on the analysis, and manage redundant sections in the plurality of memory sections based on the detected precursor.

27. The memory device according to claim 1 wherein:
the memory array includes at least one non-volatile memory array including a plurality of memory elements; and
the control logic is operable to monitor writes to the plurality of memory elements of the non-volatile memory array, and allocate as redundant sections ones of the plurality of memory sections characterized by write endurance.

28. The memory device according to claim 1 wherein:
the memory array includes at least one non-volatile memory array including a plurality of memory elements; and
the control logic is operable to monitor writes to the plurality of memory elements of the non-volatile memory array, and allocate as redundant sections ones of the plurality of memory sections that have a history of fewer writes.

29. The memory device according to claim 1 wherein:
the memory array includes at least one non-volatile memory array that is partitioned into a plurality of memory blocks; and
the control logic is partitioned into a plurality of command logic blocks spatially distributed over the non-volatile memory array wherein ones of the plurality of command logic blocks are associated with ones of the plurality of memory blocks.

30. The memory device according to claim 1 wherein:
the control logic is operable to operate in combination with the non-volatile memory array to accumulate information about a product.

31. A method of operating a memory device comprising:
providing a memory array including a plurality of memory sections characterized by a plurality of memory types;
providing a control logic integrated with and distributed over the memory array; and
operating the control logic to selectively allocate redundant sections in the plurality of memory sections.

32. A memory system comprising:
means for storing information in a memory array including a plurality of memory sections characterized by a plurality of memory types;
means integrated with and distributed over the memory array for controlling the means for storing information; and
means for selectively allocating redundant sections in the plurality of memory sections.

33. A system comprising:
circuitry for storing information in a memory array including a plurality of memory sections characterized by a plurality of memory types;
circuitry integrated with and distributed over the memory array for controlling the means for storing information; and
circuitry for selectively allocating redundant sections in the plurality of memory sections.

* * * * *

UNITED STATES PATENT AND TRADEMARK OFFICE
CERTIFICATE OF CORRECTION

PATENT NO.         : 8,966,310 B2
APPLICATION NO.    : 13/678439
DATED              : February 24, 2015
INVENTOR(S)        : Roderick A. Hyder et al.

It is certified that error appears in the above-identified patent and that said Letters Patent is hereby corrected as shown below:

Claims
    At Column 38, Lines 17, Claim 10 please replace "at least one of the a plurality" with -- at least one of the plurality --

Signed and Sealed this
Twelfth Day of July, 2016

Michelle K. Lee
*Director of the United States Patent and Trademark Office*